(12) United States Patent
Toyooka

(10) Patent No.: US 10,649,590 B2
(45) Date of Patent: May 12, 2020

(54) TRANSFER FILM, ELECTRODE PROTECTIVE FILM FOR ELECTROSTATIC CAPACITANCE-TYPE INPUT DEVICE, LAMINATE, METHOD FOR MANUFACTURING LAMINATE, AND ELECTROSTATIC CAPACITANCE-TYPE INPUT DEVICE

(71) Applicant: FUJIFILM Corporation, Tokyo (JP)

(72) Inventor: Kentaro Toyooka, Fujinomiya (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 196 days.

(21) Appl. No.: 15/673,669

(22) Filed: Aug. 10, 2017

(65) Prior Publication Data
US 2017/0364177 A1 Dec. 21, 2017

Related U.S. Application Data

(63) Continuation of application No. PCT/JP2016/055694, filed on Feb. 25, 2016.

(30) Foreign Application Priority Data

Mar. 24, 2015 (JP) ................. 2015-060478

(51) Int. Cl.
*G06F 3/044* (2006.01)
*B32B 3/10* (2006.01)
(Continued)

(52) U.S. Cl.
CPC ............... *G06F 3/044* (2013.01); *B32B 3/10* (2013.01); *B32B 7/02* (2013.01); *B32B 17/06* (2013.01); *B32B 23/08* (2013.01); *B32B 23/20* (2013.01); *B32B 27/00* (2013.01); *B32B 27/08* (2013.01); *B32B 27/302* (2013.01); *B32B 27/304* (2013.01); *B32B 27/306* (2013.01);
(Continued)

(58) Field of Classification Search
CPC ....... G06F 3/044; B32B 27/00; B32B 27/308; B32B 3/10; B32B 2457/208; G03F 7/033; G03F 7/161; Y10T 428/24802
See application file for complete search history.

(56) References Cited

FOREIGN PATENT DOCUMENTS

| CN | 204065659 U | 12/2014 |
|---|---|---|
| JP | 2001-26749 A | 1/2001 |

(Continued)

OTHER PUBLICATIONS

Machine translation of detailed description of WO 2014-156520 acquired from JPO Sep. 15, 2019.*

(Continued)

*Primary Examiner* — Gerard Higgins
(74) *Attorney, Agent, or Firm* — Sughrue Mion, PLLC

(57) ABSTRACT

The transfer film includes a temporary support and a photosensitive transparent resin layer formed on the temporary support, in which the photosensitive transparent resin layer includes a binder polymer, a photopolymerizable compound having an ethylenic unsaturated group, a photopolymerization initiator, and a blocked isocyanate, the binder polymer is a carboxyl group-containing acrylic resin having an acid value of 60 mgKOH/g or more, and the transfer film is to protect electrodes in electrostatic capacitance-type input devices.

7 Claims, 9 Drawing Sheets

(51) Int. Cl.
  *B32B 27/00* (2006.01)
  *G03F 7/033* (2006.01)
  *G03F 7/16* (2006.01)
  *B32B 27/30* (2006.01)
  *C08F 290/12* (2006.01)
  *G03F 7/11* (2006.01)
  *B32B 7/02* (2019.01)
  *B32B 27/36* (2006.01)
  *C09D 151/00* (2006.01)
  *B32B 27/34* (2006.01)
  *B32B 17/06* (2006.01)
  *B32B 27/32* (2006.01)
  *B32B 27/40* (2006.01)
  *B32B 23/20* (2006.01)
  *B32B 27/08* (2006.01)
  *B32B 23/08* (2006.01)
  *C08F 265/06* (2006.01)
  *B32B 37/02* (2006.01)
  *C08F 290/00* (2006.01)
  *G03F 7/09* (2006.01)

(52) U.S. Cl.
  CPC ............ *B32B 27/308* (2013.01); *B32B 27/32* (2013.01); *B32B 27/325* (2013.01); *B32B 27/34* (2013.01); *B32B 27/36* (2013.01); *B32B 27/365* (2013.01); *B32B 27/40* (2013.01); *B32B 37/02* (2013.01); *C08F 265/06* (2013.01); *C08F 290/00* (2013.01); *C08F 290/126* (2013.01); *C09D 151/003* (2013.01); *G03F 7/033* (2013.01); *G03F 7/094* (2013.01); *G03F 7/11* (2013.01); *G03F 7/161* (2013.01); *G03F 7/168* (2013.01); *B32B 2250/04* (2013.01); *B32B 2250/24* (2013.01); *B32B 2264/102* (2013.01); *B32B 2307/20* (2013.01); *B32B 2307/306* (2013.01); *B32B 2307/40* (2013.01); *B32B 2307/412* (2013.01); *B32B 2307/418* (2013.01); *B32B 2307/7265* (2013.01); *B32B 2307/732* (2013.01); *B32B 2307/748* (2013.01); *B32B 2457/00* (2013.01); *B32B 2457/208* (2013.01); *G06F 2203/04103* (2013.01); *Y10T 428/24802* (2015.01)

(56) References Cited

FOREIGN PATENT DOCUMENTS

| JP | 2003-307833 A | 10/2003 |
| JP | 2006-208824 A | 8/2006 |
| JP | 2014-74927 A | 4/2014 |
| JP | 2015-52774 A | 3/2015 |
| WO | 2014/156520 A1 | 10/2014 |
| WO | 2015/012134 A1 | 3/2017 |

OTHER PUBLICATIONS

Communication dated Aug. 9, 2019, from the State Intellectual Property Office of People's Republic of China in counterpart Application No. 201680009235.4.
International Search Report of PCT/JP2016/055694, dated Apr. 26, 2016. [PCT/ISA/210].
Communication dated Sep. 26, 2017 issued by the Japanese Patent Office in counterpart application No. 2015-060478.
International Preliminary Report on Patentability with the translation of Written Opinion dated Sep. 26, 2017, issued by the International Bureau in international application No. PCT/JP2016/055694.

* cited by examiner

TRANSFER FILM, ELECTRODE PROTECTIVE FILM FOR ELECTROSTATIC CAPACITANCE-TYPE INPUT DEVICE, LAMINATE, METHOD FOR MANUFACTURING LAMINATE, AND ELECTROSTATIC CAPACITANCE-TYPE INPUT DEVICE

CROSS-REFERENCE TO RELATED APPLICATIONS

This application is a Continuation of PCT International Application No. PCT/JP2016/055694, filed on Feb. 25, 2016, which claims priority under 35 U.S.C. § 119(a) to Japanese Patent Application No. 2015-060478, filed on Mar. 24, 2015. Each of the above application(s) is hereby expressly incorporated by reference, in its entirety, into the present application.

BACKGROUND OF THE INVENTION

1. Field of the Invention

The present invention relates to a transfer film, an electrode protective film for an electrostatic capacitance-type input device, a laminate, a method for manufacturing a laminate, and an electrostatic capacitance-type input device. Specifically, the present invention relates to an electrostatic capacitance-type input device in which locations touched by a finger can be detected from changes in electrostatic capacitance, a transfer film, an electrode protective film, and a laminate which can be used for electrostatic capacitance-type input devices, and a method for manufacturing the laminate. More specifically, the present invention relates to a transfer film which can be used to form electrode protective films for electrostatic capacitance-type input devices having excellent heat and moisture resistance after the supply of saline water and developability, an electrode protective film for an electrostatic capacitance-type input device and a laminate for which the transfer film is used, a method for manufacturing this laminate, and an electrostatic capacitance-type input device including this laminate.

2. Description of the Related Art

Recently, as electronic devices such as mobile phones, car navigations, personal computers, ticket vending machines, and bank terminals, there are electronic devices in which a tablet-type input device is disposed on the surface of a liquid crystal display device or the like. In these electronic devices, when a user touches places displaying command images with a finger, a stylus, or the like with reference to the command images displayed on image display regions in the liquid crystal device, information corresponding to the command images is input.

As the above-described input device (touch panel), there are resistance film-type input devices, electrostatic capacitance-type input devices, and the like. The electrostatic capacitance-type input devices have an advantage that a translucent conductive film needs to be formed only on one substrate. In such electrostatic capacitance-type input devices, for example, electrode patterns extend in mutually intersecting directions, and input locations are detected by detecting changes in electrostatic capacitance between electrodes caused in a case in which the input devices are touched by a finger or the like.

For the purpose of protecting guidance wires (for example, metal wires such as copper lines) arranged in electrode patterns or frame portions in electrostatic capacitance-type input devices, a transparent resin layer is provided on a side opposite to the surface touched by a finger or the like for input.

SUMMARY OF THE INVENTION

The transparent resin layer needs to be patterned so as not to cover a terminal portion of a guidance wire in order to connect the guidance wire to other wires. As a method for forming patterns of the transparent resin layer, the photolithography needs to be used from the viewpoint of productivity. As a result of studying methods for forming accurate patterns by improving the developability of patterns in the photolithography, the present inventors found that the use of binder polymers having a high acid value for photosensitive transparent resin layers is effective.

However, the present inventors found a new problem with heat and moisture resistance which becomes poor after the supply of saline water in a case in which a binder polymer having a high acid value is used for photosensitive transparent resin layers. Specifically, as a result of testing heat and moisture resistance after forming the pattern of a transparent resin layer on an electrode pattern and on a guidance wire arranged in a frame portion in an electrostatic capacitance-type input device using a photosensitive transparent resin layer including a binder polymer having a high acid value and supplying saline water to the electrostatic capacitance-type input device, the present inventors found a problem in that indium tin oxide (ITO) electrode patterns or metal such as copper used in metal wires discolor. The above-described heat and moisture resistance after the supply of saline water is a practically important performance. When a human being touches an input surface of an electrostatic capacitance-type input device with a finger, since the electrostatic capacitance-type input device is used in hot and humid environments or a high-temperature and humidity environment is formed in the electrostatic capacitance-type input device due to charging or the like after attached sweat permeates into the protective layer of the electrostatic capacitance-type input device, the electrostatic capacitance-type input device needs to have heat resistance after the supply of saline water.

However, there have been no known transfer films that can be used to form electrode protective films for electrostatic capacitance-type input devices having excellent developability and excellent heat and moisture resistance after the supply of saline water.

Meanwhile, for applications other than electrostatic capacitance-type input devices, photosensitive resin compositions in which a binder polymer having a high acid value is used are known.

JP2006-208824A and JP2014-074927A describe photocurable resin compositions that can be used as solder resists or the like for print wire substrates. The contents described in both publications are similar to each other, and, for example, JP2014-074927A describes a carboxylic acid-containing resin, a photopolymerization initiator, a blocked isocyanate compound, a maleimide compound, and a photocurable resin composition. In JP2014-074927A, it is described that acid-modified epoxy acrylate is used as the carboxylic acid-containing resin or a polymerizable compound is used in the photocurable resin composition. In addition, JP2014-074927A also describes a dry film comprising a dried coated film obtained by applying and drying a photocurable resin composition on a film.

JP2003-307833A describes a photosensitive resin composition for screen printing having an alkali-soluble acrylic copolymer, a polyfunctional acryl acrylate monomer, a thermally crosslinkable compound that crosslinks by heat, and a polymerization initiator.

However, the use of solder resists for print wire substrates or production of plates for screen printing in hot and humid environments after being touched by a human finger has not been assumed. Therefore, for photosensitive resin compositions for solder resists for print wire substrates or photosensitive resin compositions for production of plates for screen printing, heat and moisture resistance after curing and then the supply of saline water has not been treated as a problem. No attention has been paid to heat and moisture resistance after the supply of saline water in all of JP2006-208824A, JP2014-074927A, and JP2003-307833A.

In addition, in all of JP2006-208824A, JP2014-074927A, and JP2003-307833A, there are no descriptions implying the use of the photosensitive resin compositions for the application of electrostatic capacitance-type input devices. Since the photosensitive resin composition for solder resists for print wire substrates or the photosensitive resin composition for production of plates for screen printing is not intended to be laminated on image display portions in image display devices, generally, solder resists or plates are colored, or the transparency deteriorates. Therefore, those skilled in the art have not thus far studied the alternative use of the photosensitive resin composition for solder resists for print wire substrates or the photosensitive resin composition for production of plates for screen printing for the application of electrostatic capacitance-type input devices.

In the application of electrostatic capacitance-type input devices, developability and heat and moisture resistance after the supply of saline water become particularly important. An object of the present invention is to provide a transfer film which is excellent in both developability and heat and moisture resistance after the supply of saline water and can be used to form electrode protective films for electrostatic capacitance-type input devices.

The present inventors found that electrode protective films for electrostatic capacitance-type input devices having excellent heat and moisture resistance after the supply of saline water and excellent developability can be formed by using a specific binder polymer having a high acid value and jointly using blocked isocyanate.

The present invention which is specific means for achieving the above-described objects will be described below.

[1] A transfer film for protecting electrodes in electrostatic capacitance-type input devices, the film comprising: a temporary support; and a photosensitive transparent resin layer formed on the temporary support, in which the photosensitive transparent resin layer includes a binder polymer including a carboxyl group-containing acrylic resin having an acid value of 60 mgKOH/g or more, a photopolymerizable compound having an ethylenic unsaturated group, a photopolymerization initiator, and a blocked isocyanate.

[2] In the transfer film according to [1], a dissociation temperature of the blocked isocyanate is preferably 100° C. to 160° C.

[3] In the transfer film according to [1] or [2], a thickness of the photosensitive transparent resin layer is preferably 1 to 20 μm.

[4] In the transfer film according to any one of [1] to [3], at least one photopolymerizable compound preferably contains a carboxyl group.

[5] In the transfer film according to any one of [1] to [4], the blocked isocyanate preferably has an isocyanurate structure.

[6] The transfer film according to any one of [1] to [5] preferably further comprises: a second transparent resin layer formed on the photosensitive transparent resin layer, in which a refractive index of the second transparent resin layer is higher than a refractive index of the photosensitive transparent resin layer.

[7] An electrode protective film for an electrostatic capacitance-type input device obtained by removing a temporary support from the transfer film according to any one of [1] to [6].

[8] A laminate formed by transferring a photosensitive transparent resin layer onto a substrate including an electrode of an electrostatic capacitance-type input device using the transfer film according to any one of [1] to [6].

[9] A laminate comprising: a substrate including an electrode of an electrostatic capacitance-type input device; and a photosensitive transparent resin layer formed on the substrate, in which the photosensitive transparent resin layer includes a binder polymer including a carboxyl group-containing acrylic resin having an acid value of 60 mgKOH/g or more, a photopolymerizable compound having an ethylenic unsaturated group, a photopolymerization initiator, and a blocked isocyanate.

[10] In the laminate according to [8] or [9], the photosensitive transparent resin layer preferably includes a carboxylic acid anhydride.

[11] In the laminate according to any one of [8] to [10], the electrode of the electrostatic capacitance-type input device is preferably a transparent electrode pattern.

[12] A method for manufacturing a laminate comprising: a step of transferring a photosensitive transparent resin layer onto a substrate including an electrode of an electrostatic capacitance-type input device using the transfer film according to any one of [1] to [6].

[13] In the method for manufacturing a laminate according to [12], the substrate is preferably a transparent film substrate.

[14] The method for manufacturing a laminate according to [12] or [13], preferably further comprises: a step of turning at least a part of the carboxyl group-containing acrylic resin into a carboxylic acid anhydride by heating the transferred photosensitive transparent resin layer.

[15] A laminate manufactured using the method for manufacturing a laminate according to any one of [12] to [14].

[16] An electrostatic capacitance-type input device comprising: the laminate according to any one of [8] to [11] and [15].

According to the present invention, it is possible to provide a transfer film which can be used to form electrode protective films for electrostatic capacitance-type input devices having excellent heat and moisture resistance after the supply of saline water and excellent developability.

BRIEF DESCRIPTION OF THE DRAWINGS

FIG. 14 is a schematic view illustrating an example of a state in which the transfer film of the present invention having the photosensitive transparent resin layer and a second transparent resin layers is laminated on the transparent electrode pattern in the electrostatic capacitance-type input device by means of lamination and is yet to be cured by means of exposure or the like.

DESCRIPTION OF THE PREFERRED EMBODIMENTS

Figure 1A:
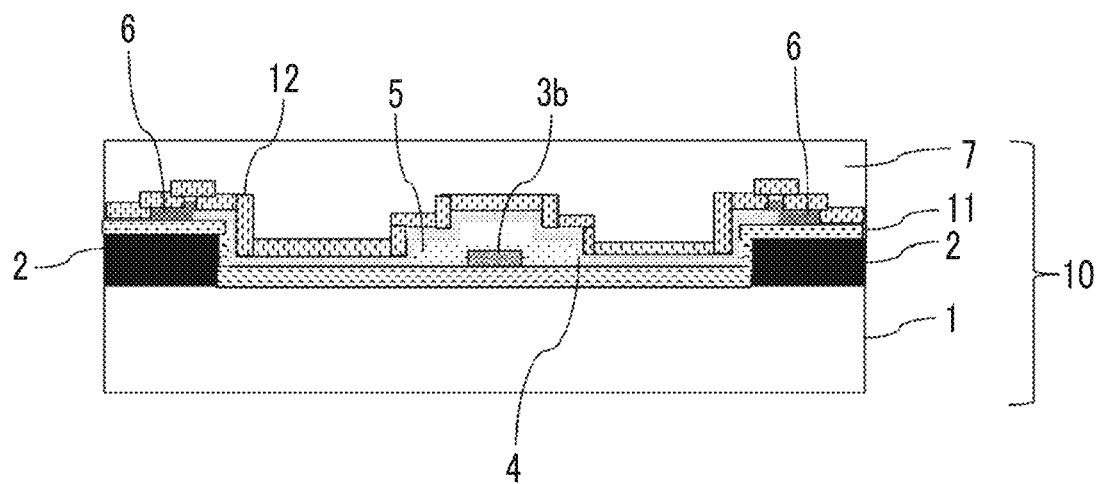
FIG. 1A is a schematic cross-sectional view illustrating an example of a constitution of an electrostatic capacitance-type input device of the present invention.

Hereinafter, a transfer film, an electrode protective film for an electrostatic capacitance-type input device, a laminate, and an electrostatic capacitance-type input device of the present invention will be described. Hereinafter, constituent requirements will be described on the basis of typical embodiments or specific examples of the present invention in some cases, but the present invention is not limited to these embodiments or specific examples. Meanwhile, in the present specification, numerical ranges expressed using "to" includes numerical values before and after the "to" as the lower limit value and the upper limit value.

[Transfer Film]

The transfer film of the present invention is a transfer film which has a temporary support and a photosensitive transparent resin layer formed on the temporary support, in which the photosensitive transparent resin layer includes a binder polymer, a photopolymerizable compound having an ethylenic unsaturated group, a photopolymerization initiator, and a blocked isocyanate, the binder polymer is a carboxyl group-containing acrylic resin having an acid value of 60 mgKOH/g or more, and the transfer film is to protect electrodes in electrostatic capacitance-type input devices.

When the above-described constitution is provided, the transfer film of the present invention can be used to form electrode protective films for electrostatic capacitance-type input devices having excellent developability and excellent heat and moisture resistance after the supply of saline water.

Although not related to any theories, it is anticipated that, even in a case in which developability is enhanced using a binder polymer having a high acid value in the photosensitive transparent resin layer, according to the constitution of the present invention, in the photosensitive transparent resin layer that has been irradiated with light (ultraviolet rays) and heated, the photopolymerizable compound forms a crosslinking structure densely enough to sufficiently shield saline water. Therefore, heat and moisture resistance after the supply of saline water after the exposure of the transferred photosensitive transparent resin layer can be improved. Particularly, it is assumed that an increase in the three-dimensional crosslinking density, the anhydrization and hydrophobilization of the carboxyl group in the carboxyl group-containing resin, or the like, which is achieved by thermal crosslinking caused by the addition of the blocked isocyanate to the carboxyl group-containing resin, contributes to the improvement of heat and moisture resistance after the supply of saline water.

Meanwhile, in a case in which the reaction percentage of the photopolymerizable compound in the photosensitive transparent resin layer is increased by increasing the light irradiation amount and thus the three-dimensional crosslinking density is increased, cured films significantly contract due to curing, and the adhesiveness between the transferred photosensitive transparent resin layer and a substrate may be impaired. According to a preferred aspect of the transfer film of the present invention, it is possible to form electrode protective films for electrostatic capacitance-type input devices having excellent developability and excellent heat and moisture resistance after the supply of saline water without increasing the light irradiation amount, and thus the adhesiveness between the transferred photosensitive transparent resin layer and a substrate is also likely to be favorable.

Hereinafter, a preferred aspect of the transfer film of the present invention will be described.

Meanwhile, the transfer film of the present invention is preferably used to form transparent insulating layers or transparent protective layers for electrostatic capacitance-type input devices. Since the photosensitive transparent resin layer is in a non-cured state, the transfer film of the present invention can be used as a transfer film for forming the laminate patterns of electrode protective films for electrostatic capacitance-type input devices, more preferably as a transfer film for forming the laminate patterns of refractive index-adjusting layers and overcoat layers (transparent protective layers) on transparent electrode patterns by means of the photolithography.

<Temporary Support>

The temporary support that is used in the transfer film is not particularly limited.

(Thickness)

The thickness of the temporary support is not particularly limited, but generally in a range of 5 to 200 μm and, particularly, preferably in a range of 10 to 150 μm from the viewpoint of easy handling, versatility, and the like.

(Material)

The temporary support is preferably a film and more preferably a resin film.

As the film that is used as the temporary support, it is possible to use flexible materials that do not significantly deform, contract, or extend under pressurization or under pressurization and heating. Examples of the above-described temporary support include polyethylene terephthalate films, triacetylcellulose films, polystyrene films, polycarbonate films, and the like, and, among these, biaxially-stretched polyethylene terephthalate films are particularly preferred.

In addition, the temporary support may be transparent and may contain dyed silicon, an alumina sol, a chromium salt, a zirconium salt, or the like.

In addition, the temporary support can be imparted with a conductive property using the method described in JP2005-221726A.

<Constitution of Photosensitive Transparent Resin Layer>

The photosensitive transparent resin layer may be photocurable or heat-curable and photocurable. Among these, the photosensitive transparent resin layer and a second transparent resin layer described below are preferably heat-curable transparent resin layers and photocurable transparent resin layers since it is easy to form films by photocuring the layer after transfer and reliability can be imparted to films by means of heat-curing after the formation of films.

Meanwhile, in the present specification, for the convenience in description, the photosensitive transparent resin layer and the second transparent resin layer in the transfer film will be termed as the same title regardless of the curing state.

For example, in a case in which the photosensitive transparent resin layer and the second transparent resin layer in the transfer film of the present invention are transferred onto a transparent electrode pattern, are photocured, and thus become no longer photocurable, these layers will be continuously termed as the photosensitive transparent resin layer and the second transparent resin layer respectively regardless of whether or not the layers are heat-curable. Furthermore, there are cases in which these layers are photocured and then heat-cured, and even in these cases, these layers will be continuously termed as the photosensitive transparent resin layer and the second transparent resin layer respectively regardless of whether or not the layers are curable.

Similarly, in a case in which the photosensitive transparent resin layer and the second transparent resin layer in the transfer film of the present invention are transferred onto a transparent electrode pattern, are heat-cured, and thus become no longer heat-curable, these layers will be continuously termed as the photosensitive transparent resin layer and the second transparent resin layer respectively regardless of whether or not the layers are photocurable.

(Thickness)

In the transfer film of the present invention, the thickness of the photosensitive transparent resin layer is preferably 1 to 20 μm, more preferably 2 to 15 μm, and particularly preferably 3 to 12 μm. When the thickness of the photosensitive transparent resin layer is sufficiently thick, it is possible to improve the heat and moisture resistance after the supply of saline water of the transferred photosensitive transparent resin layer (particularly, after being exposed, developed, and heated). The photosensitive transparent resin layer is preferably used in image display portions of electrostatic capacitance-type input devices, and, in this case, high transparency and high light transmittance become important. When the thickness of the photosensitive transparent resin layer is sufficiently thin, a decrease in the light transmittance of the photosensitive transparent resin layer due to absorption is not easily caused. In addition, it becomes difficult to absorb short wavelengths, and thus yellow coloration is also not easily caused.

(Refractive Index)

In the transfer film of the present invention, the refractive index of the photosensitive transparent resin layer is preferably 1.50 to 1.53, more preferably 1.50 to 1.52, and particularly preferably 1.51 to 1.52.

(Composition)

The transfer film of the present invention may be a negative-type material or a positive-type material.

The transfer film of the present invention is preferably a negative-type material.

The method for controlling the refractive index of the photosensitive transparent resin layer is not particularly limited, and it is possible to singly use a transparent resin layer having a desired refractive index, use a transparent resin layer to which particles such as metal particles or metal oxide particles are added, or use a complex of a metal salt and a macromolecule.

Furthermore, in the photosensitive transparent resin layer, additives may be used. Examples of the additives include the surfactants described in Paragraph 0017 of JP4502784B and Paragraphs 0060 to 0071 of JP2009-237362A, the thermopolymerization initiators described in Paragraph 0018 of JP4502784B, and, furthermore, other additives described in Paragraphs 0058 to 0071 of JP2000-310706A.

Hitherto, a case in which the transfer film of the present invention is a negative-type material has been mainly described, but the transfer film of the present invention may be a positive-type material.

—Binder Polymer—

The transfer film of the present invention includes a binder polymer in the photosensitive transparent resin layer, and the binder polymer includes a carboxyl group-containing acrylic resin having an acid value of 60 mgKOH/g or more (hereinafter, in some cases, referred to as "specific acid value acrylic resin").

Meanwhile, the photosensitive transparent resin layer may include an additional binder polymer other than the specific acid value acrylic resin. As the additional binder polymer, an arbitrary polymer component can be used without any particular limitation, and, from the viewpoint of using the photosensitive transparent resin layer as transparent protective films in electrostatic capacitance-type input devices, polymer components having high surface hardness and favorable heat resistance are preferred, and alkali-soluble resins are more preferred. Examples of the alkali-soluble resins include well-known photosensitive siloxane resin materials and the like.

In the transfer film of the present invention, it is preferable that the binder polymer included in the organic solvent-based resin composition that is used to form the photosensitive transparent resin layer includes the specific acid value acrylic resin and both this binder polymer and a resin or binder polymer having an acidic group included in water-based resin compositions that are used to form the second transparent resin layer described below contain an acrylic resin from the viewpoint of enhancing interlaminar adhesiveness before and after the transfer of the photosensitive transparent resin layer and the second transparent resin layer. A preferred range of the binder polymer for the photosensitive transparent resin layer will be specifically described.

The binder polymer including the specific acid value acrylic resin (referred to as binder or polymer) is not particularly limited within the scope of the gist of the present invention and can be appropriately selected from well-known binder polymers. For example, it is possible to use binder polymers that are carboxyl group-containing acrylic resins having an acid value of 60 mgKOH/g or more among the polymers described in Paragraph 0025 of JP2011-95716A and binder polymers that are carboxyl group-containing acrylic resins having an acid value of 60 mgKOH/g or more among the polymers described in Paragraphs 0033 to 0052 of JP2010-237589A.

The acid value of the specific acid value acrylic resin is preferably 60 to 200 mgKOH/g, more preferably 70 to 150 mgKOH/g, and particularly preferably 80 to 110 mgKOH/g.

As the acid value of the specific acid value acrylic resin, the value of a theoretical acid value computed using the calculation method described in the following publications and the like is used. <0063> of JP2004-149806A and <0070> of JP2012-211228A.

In addition, the photosensitive transparent resin layer may include polymer latex as the binder polymer. The polymer latex mentioned herein refers to latex obtained by dispersing water-insoluble polymer particles in water. The polymer latex is described in, for example, "Chemistry of high-molecular-weight latex (published by Kobunshi Kankokai (1973))" by Muroi Soichi.

The polymer particles that can be used are preferably polymer particles of a polymer such as an acrylic polymer, a vinyl acetate-based polymer, a rubber-based (for example, styrene-butadiene-based or chloroprene-based) polymer, an olefin-based polymer, a polyester-based polymer, a polyurethane-based polymer, or a polystyrene-based polymer or a copolymer thereof.

It is preferable to strengthen the mutual bonding force between polymer chains that constitute the polymer particles. Examples of means for strengthening the mutual bonding force between polymer chains include means for using an interaction by a hydrogen bond and methods for generating a covalent bond. Means for imparting a hydrogen bonding force is preferably the introduction of a monomer having a polar group into a polymer chain by means of copolymerization or graft polymerization.

Examples of the polar group in the binder polymer include carboxyl groups (included in acrylic acid, methacrylic acid, itaconic acid, fumaric acid, maleic acid, crotonic acid, partially-esterified maleic acid, and the like), primary, secondary, and tertiary amino groups, ammonium salt groups, sulfonic acid groups (styrene sulfonate), and the like, and the specific acid value acrylic resin has at least a carboxyl group.

A preferred range of the copolymerization proportion of the monomer having the polar group is in a range of 5% to 50% by mass, more preferably 5% to 40% by mass, and still more preferably 20% to 30% by mass with respect to 100% by mass of the polymer. In the specific acid value acrylic resin, a preferred range of the copolymerization proportion of a monomer having a carboxyl group is in a range of 5% to 50% by mass, more preferably 5% to 40% by mass, and still more preferably 20% to 30% by mass with respect to 100% by mass of the polymer. Meanwhile, examples of means for generating a covalent bond include methods in which an epoxy compound, blocked isocyanate, isocyanate, a vinylsulfone compound, an aldehyde compound, a methylol compound, a carboxylic acid anhydride, or the like is reacted with a hydroxyl group, a carboxyl group, a primary or secondary amino group, an acetoacetyl group, a sulfonic acid, or the like.

The weight-average molecular weight of the polymer is preferably 10,000 or more and more preferably 20,000 to 100,000.

The polymer latex that can be used in the present invention may be polymer latex obtained by emulsification polymerization or polymer latex obtained by emulsification. Methods for preparing the polymer latex are described in, for example, "Emulsion Latex Handbook" (edited by the emulsion latex handbook editorial committee, published by Taiseisha Ltd. (1975)).

Examples of the polymer latex that can be used in the present invention include polymer latex obtained by means of the ammonia-neutralization and emulsification of alkyl acrylate copolymer-ammonium (trade name: JURYMER AT-210, manufactured by Nippon Kayaku Co., Ltd.), alkyl acrylate copolymer-ammonium (trade name: JURYMER ET-410, manufactured by Nippon Kayaku Co., Ltd.), alkyl acrylate copolymer-ammonium (trade name: JURYMER AT-510, manufactured by Nippon Kayaku Co., Ltd.), or polyacrylic acid (trade name: JURYMER AC-10L, manufactured by Nippon Kayaku Co., Ltd.).

—Photopolymerizable Compound—

In the transfer film of the present invention, the photosensitive transparent resin layer includes a photopolymerizable compound having an ethylenic unsaturated group. The photopolymerizable compound having an ethylenic unsaturated group needs to have at least one ethylenic unsaturated group as a photopolymerizable group and may have an epoxy group or the like in addition to the ethylenic unsaturated group. The transfer film more preferably includes a compound having a (meth)acryloyl group as the photopolymerizable compound in the photosensitive transparent resin layer.

As the photopolymerizable compound used in the transfer film, only one compound may be used singly or a combination of two or more compounds may be used, but a combination of two or more compounds is preferably used from the viewpoint of improving heat and moisture resistance after the supply of saline water after the exposure of the transferred photosensitive transparent resin layer. As the photopolymerizable compound used in the transfer film of the present invention, a combination of a tri- or higher-functional photopolymerizable compound and a difunctional photopolymerizable compound is preferably used from the viewpoint of improving heat and moisture resistance after the supply of saline water after the exposure of the transferred photosensitive transparent resin layer. The proportion of the difunctional photopolymerizable compound used in all of the photopolymerizable compounds is preferably in a range of 10% to 90% by mass, more preferably in a range of 20% to 85% by mass, and particularly preferably in a range of 30% to 80% by mass. The proportion of the tri- or higher-functional photopolymerizable compound used in all of the photopolymerizable compounds is preferably in a range of 10% to 90% by mass, more preferably in a range of 15% to 80% by mass, and particularly preferably in a range of 20% to 70% by mass. The transfer film preferably includes, as the photopolymerizable compounds, at least a compound having two ethylenic unsaturated groups or a compound having at least three ethylenic unsaturated groups and more preferably includes at least a compound having two (meth)acryloyl groups or a compound having at least three ethylenic (meth)acryloyl groups.

In addition, in the transfer film of the present invention, at least one photopolymerizable compound having an ethylenic unsaturated group preferably contains a carboxyl group since the carboxyl group in the binder polymer and the carboxyl group in the photopolymerizable compound having an ethylenic unsaturated group form a carboxylic acid anhydride and, furthermore, heat and moisture resistance after the supply of saline water can be enhanced.

The photopolymerizable compound having an ethylenic unsaturated group containing a carboxyl group is not particularly limited, and commercially available compounds can be used. For example, ARONIX TO-2349 (manufactured by Toagosei Co., Ltd.), ARONIX M-520 (manufactured by Toagosei Co., Ltd.), ARONIX M-510 (manufactured by Toagosei Co., Ltd.), and the like can be preferably used. The proportion of the photopolymerizable compound having an ethylenic unsaturated group containing a carboxyl group used in all of the photopolymerizable compounds is preferably in a range of 1% to 50% by mass, more preferably in a range of 1% to 30% by mass, and particularly preferably in a range of 5% to 15% by mass.

The transfer film preferably includes, as the photopolymerizable compound, an urethane (meth)acrylate compound. The amount of the urethane (meth)acrylate compound mixed is preferably 10% by mass or more and more preferably 20% by mass or more of all of the photopolymerizable compounds. In the urethane (meth)acrylate compound, the number of (meth)acryloyl groups is preferably three or more and more preferably four or more.

The photopolymerizable compound having a difunctional ethylenic unsaturated group is not particularly limited as long as the compound has two ethylenic unsaturated groups in the molecule, and commercially available (meth)acrylate compounds can be used. For example, it is possible to preferably use tricyclodecane dimethanol diacrylate (A-DCP, manufactured by Shin-Nakamura Chemical Co., Ltd.), tricyclodecane dimethanol dimethacrylate (DCP, manufactured by Shin-Nakamura Chemical Co., Ltd.), 1,9-nonanediol diacrylate (A-NOD-N, manufactured by Shin-Nakamura Chemical Co., Ltd.), 1,6-hexanediol diacrylate (A-HD-N, manufactured by Shin-Nakamura Chemical Co., Ltd.), and the like.

The photopolymerizable compound having a tri- or higher-functional ethylenic unsaturated group is not particularly limited as long as the compound has three or more ethylenic unsaturated groups in the molecule, and, for example, it is possible to use (meth)acrylate compounds having a skeleton such as dipentaerythritol (tri/tetra/penta/hexa)acrylates, pentaerythritol (tri/tetra)acrylates, trimethylolpropane triacrylate, ditrimethylolpropane tetraacrylate, and isocyanurate acrylate, and (meth)acrylate compounds having a long span length between (meth)acrylates are preferred. Specifically, it is possible to preferably use the caprolactone-modified compounds (KAYARAD DPCA manufactured by Nippon Kayaku Co., Ltd., A-9300-1CL manufactured by Shin-Nakamura Chemical Co., Ltd., and the like) and the alkylene oxide-modified compounds (KAYARAD RP-1040 manufactured by Nippon Kayaku Co., Ltd., ATM-35E and A-9300 manufactured by Shin-Nakamura Chemical Co., Ltd., EBECRYL 135 manufactured by Daicel-Allnex Ltd., and the like) of the above-described (meth)acrylate compounds having a skeleton such as dipentaerythritol (tri/tetra/penta/hexa)acrylates, pentaerythritol (tri/tetra)acrylates, trimethylolpropane triacrylate, ditrimethylolpropane tetraacrylate, and isocyanurate acrylate. In addition, it is preferable to use tri- or higher-functional urethane (meth)acrylates. As the tri- or higher-functional urethane (meth)acrylates, it is possible to preferably use 8UX-015A (manufactured by Taisei Fine Chemical Co., Ltd.), UA-32P (manufactured by Shin-Nakamura Chemical Co., Ltd.), UA-1100H (manufactured by Shin-Nakamura Chemical Co., Ltd.,), and the like.

The average molecular weight of the photopolymerizable compound used in the transfer film is preferably 200 to 3,000, more preferably 250 to 2,600, and particularly preferably 280 to 2,200.

—Photopolymerization Initiator—

When the photosensitive transparent resin layer includes the photopolymerizable compound and the photopolymerization initiator, it is possible to facilitate the formation of patterns of the photosensitive transparent resin layer.

As the photopolymerization initiator that the photosensitive transparent resin layer may include, it is possible to use the photopolymerization initiators described in Paragraphs 0031 to 0042 of JP2011-95716A. For example, it is possible to preferably use 1,2-octane dione, 1-[4-(phenylthio)-, 2-(O-benzoyloxime)] (trade name: IRGACURE OXE-01, manufactured by BASF), additionally, ethanone, 1-[9-ethyl-6-(2-methylbenzoyl)-9H-carbazole-3-yl]-, 1-(O-acetyloxime) (trade name: IRGACURE OXE-02, manufactured by BASF), 2-(dimethylamino)-2-[(4-methylphenyl)methyl]-1-[4-(4-morpholinyl)phenyl]-1-butanone (trade name: IRGACURE 379EG, manufactured by BASF), 2-methyl-1-(4-methyl thiophenyl)-2-morpholino-propan-1-one (trade name: IRGACURE 907, manufactured by BASF), 2-hydroxy-1-{4-[4-(2-hydroxy-2-methyl-propionyl)-benzyl] phenyl}-2-methyl-propan-1-one (trade name: IRGACURE 127, manufactured by BASF), 2-benzyl-2-dimethylamino-1-(4-morpholinophenyl)-butanone-1 (trade name: IRGACURE 369, manufactured by BASF), 2-hydroxy-2-methyl-1-phenyl-erypropan-1-one (trade name: IRGACURE 1173, manufactured by BASF), 1-hydroxy-cyclohexyl-phenyl-ketone (trade name: IRGACURE 184, manufactured by BASF), 2,2-dimethoxy-1,2-diphenyl ethan-1-one (trade name: IRGACURE 651, manufactured by BASF), oxime ester-based photopolymerization initiator (trade name: Lunar 6, manufactured by DKSH Japan K.K.), and the like.

In the photosensitive transparent resin layer, the content of the photopolymerization initiator is preferably 1% by mass or more and more preferably 2% by mass or more of the photosensitive transparent resin layer. In the photosensitive transparent resin layer, the content of the photopolymerization initiator is preferably 10% by mass or less and more preferably 5% by mass or less of the photosensitive transparent resin layer from the viewpoint of improving the patterning property and substrate adhesiveness of the laminate of the present invention.

—Blocked Isocyanate—

In the transfer film of the present invention, the photosensitive transparent resin layer has blocked isocyanate. The blocked isocyanate refers to "a compound having a structure in which an isocyanate group in isocyanate is protected (masked) with a blocking agent".

In the transfer film of the present invention, the dissociation temperature of the blocked isocyanate is preferably 100° C. to 160° C. and particularly preferably 130° C. to 150° C.

In the present specification, the dissociation temperature of the blocked isocyanate refers to "the temperature of an endothermic peak generated by a deprotection reaction of the blocked isocyanate in the case of being measured by means of differential scanning calorimetry (DSC) using a differential scanning calorimeter (manufactured by Seiko Instruments Inc., DSC6200)".

Examples of the blocking agent having a dissociation temperature of 100° C. to 160° C. include pyrazole-based compounds (3,5-dimethylpyrazole, 3-methylpyrazole, 4-bromo-3,5-dimethylpyrazole, 4-nitro-3,5-dimethylpyrazole, and the like), active methylene-based compounds (malonic acid diesters (dimethyl malonate, diethyl malonate, di-n-butyl malonate, and di 2-ethylhexyl malonate) and the like), triazole-based compounds (1,2,4-triazole and the like), oxime-based compounds (formaldoxime, acetoaldoxime, acetoxime, methyl ethyl ketoxime, and cyclohexanone oxime), and the like. Among these, from the viewpoint of storage stability, oxime-based compounds and pyrazole-based compounds are preferred, and oxime-based compounds are particularly preferred.

In the transfer film of the present invention, the blocked isocyanate preferably an isocyanurate structure from the viewpoint of the toughness of films and base material bonding forces.

Among blocked isocyanates having an isocyanurate structure, oxime-based compounds A are more preferred than compounds B not having an oxime structure since it is easy to set the dissociation temperature in a preferred range and enhance developability.

In the blocked isocyanate, the number of blocked isocyanate groups per molecule is preferably 1 to 10, more preferably 2 to 6, and particularly preferably 3 or 4.

Specific examples of the blocked isocyanate that is used in the transfer film of the present invention include the following compounds. However, the blocked isocyanate that is used in the present invention is not limited to the following specific examples.

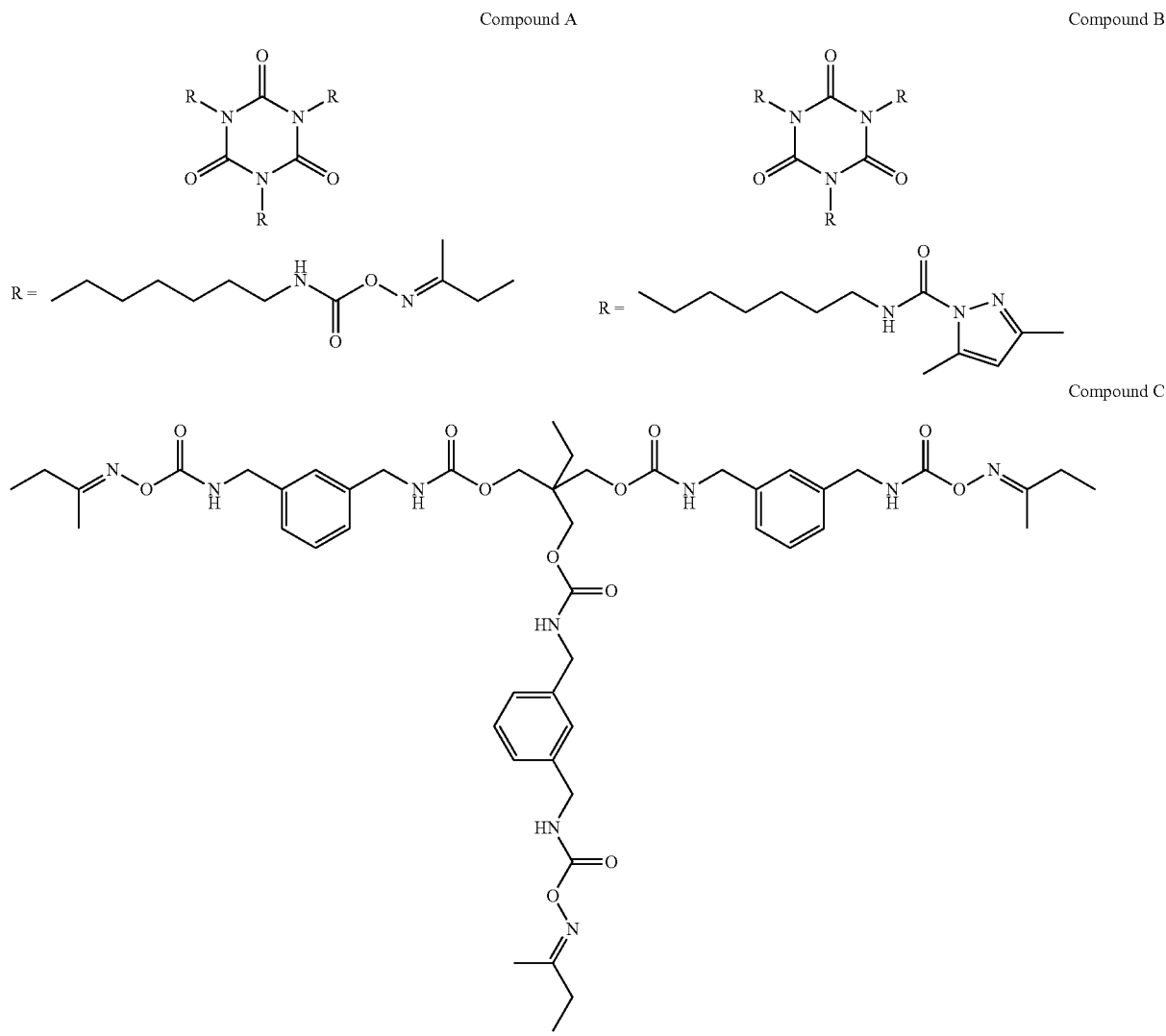

As the blocked isocyanate that is used in the transfer film of the present invention, it is possible to use commercially available blocked isocyanates. Examples thereof include TAKENATE (registered trademark) B870N (manufactured by Mitsui Chemicals, Inc.) which is a methyl ethyl ketone oxime blocked body of isophorone diisocyanate, DURAN-ATE (registered trademark) MF-K60B (manufactured by Asahi Kasei Corporation) which is a hexamethylene diisocyanate-based blocked isocyanate compound, and the like.

The molecular weight of the blocked isocyanate that is used in the transfer film is preferably 200 to 3,000, more preferably 250 to 2,600, and particularly preferably 280 to 2,200.

—Metal oxide particles—

The photosensitive transparent resin layer may or may not include particles (preferably metal oxide particles) for the purpose of adjusting the refractive index or the light transmittance. In order to control the refractive index of the photosensitive transparent resin layer in the above-described range, it is possible to add metal oxide particles to the resin layer in an arbitrary ratio depending on the kind of the polymer or the polymerizable compound being used. In the photosensitive transparent resin layer, the content of the metal oxide particles is preferably 0% to 35% by mass, more preferably 0% to 10% by mass, and particularly preferably 0% by mass of the photosensitive transparent resin layer.

Since the metal oxide particles are highly transparent and light-transmissible, it is possible to obtain positive-type photosensitive resin compositions having a high refractive index and excellent transparency.

The metal oxide particles preferably have a refractive index higher than the refractive index of a composition made of a material obtained by removing these particles from the photosensitive transparent resin layer.

Meanwhile, the metal of the above-described metal oxide particles may also be a semi-metal such as B, Si, Ge, As, Sb, or Te.

The metal oxide particles which are light-transmissible and have a high refractive index are preferably oxide particles including atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, and Te, more preferably titanium oxide, titanium complex oxide, zinc oxide, zirconium oxide, indium/tin oxide, or antimony/tin oxide, still more preferably titanium oxide, titanium complex oxide, or zirconium oxide, particularly preferably titanium oxide or zirconium oxide, and most preferably titanium dioxide. Particularly, titanium dioxide is preferably rutile-type titanium oxide having a high refractive index. The surfaces of these metal oxide particles can also be treated with an organic material in order to impart dispersion stability.

From the viewpoint of the transparency of the photosensitive transparent resin layer, the average primary particle diameter of the metal oxide particles is preferably 1 to 200 nm and particularly preferably 3 to 80 nm. Here, the average primary particle diameter of particles refers to the arithmetic average of measurement results obtained by measuring the particle diameters of 200 arbitrary particles using an electronic microscope. In addition, in a case in which the shapes of particles are not spherical, the longest sides are considered as the diameters.

In addition, one kind of the metal oxide particles may be used or two or more kinds of the metal oxide particles can be jointly used.

In the transfer film of the present invention, the photosensitive transparent resin layer preferably has at least one of $ZrO_2$ particles, $Nb_2O_5$ particles, or $TiO_2$ particles from the viewpoint of controlling the refractive index in the range of the refractive index of the photosensitive transparent resin layer, $ZrO_2$ particles and $Nb_2O_5$ particles are more preferred, and $ZrO_2$ particles are still more preferably included.

<Constitution of Second Transparent Resin Layer>

The transfer film of the present invention preferably has a second transparent resin layer on the photosensitive transparent resin layer and more preferably has a second transparent resin layer disposed adjacent to the photosensitive transparent resin layer.

The second transparent resin layer may be heat-curable, photocurable, or heat-curable and photocurable. Among these, the second transparent resin layer is preferably at least a heat-curable transparent resin layer since reliability can be imparted to films by means of heat-curing after transfer. In addition, the second transparent resin layer is more preferably a heat-curable transparent resin layer and a photocurable transparent resin layer since it is easy to form films by photo-curing the layer after transfer and reliability can be imparted to films by means of heat-curing after the formation of films.

(Refractive Index)

The transfer film of the present invention preferably has the second transparent resin layer on the photosensitive transparent resin layer, and the refractive index of the second transparent resin layer is more preferably higher than the refractive index of the photosensitive transparent resin layer.

When the refractive index difference between a transparent electrode pattern (preferably ITO) and the second transparent resin layer and the refractive index difference between the second transparent resin layer and the photosensitive transparent resin layer are decreased, light reflection is alleviated and thus the transparent electrode pattern becomes barely visible, and it is possible to improve the visibility of the transparent electrode pattern.

In addition, even when the photosensitive transparent resin layer is laminated and then the second transparent resin layer is laminated without curing the photosensitive transparent resin layer, layer differentiation becomes favorable. Therefore, the visibility of the transparent electrode pattern can be improved with the above-described mechanism. In addition, after the refractive index-adjusting layers (that is, the photosensitive transparent resin layer and the second transparent resin layer) are transferred onto the transparent electrode pattern from the transfer film, it is possible to develop the refractive index-adjusting layers in desired patterns by means of photolithography. Meanwhile, in a case in which the layer differentiation between the photosensitive transparent resin layer and the second transparent resin layer is favorable, the refractive index adjustment effect of the above-described mechanism is likely to be sufficient, and the improvement of the visibility of the transparent electrode pattern is likely to be sufficient.

The refractive index of the second transparent resin layer is preferably 1.60 or higher.

Meanwhile, the refractive index of the second transparent resin layer needs to be adjusted using the refractive index of the transparent electrode, and the upper limit value of the value is not particularly limited, but is preferably 2.1 or lower and more preferably 1.78 or lower, and may be 1.74 or lower.

Particularly, in a case in which the refractive index of the transparent electrode exceeds 2.0 as in the case of an oxide of In and Zn (IZO), the refractive index of the second transparent resin layer is preferably 1.7 or higher and 1.85 or lower.

(Thickness)

In the transfer film of the present invention, the film thickness of the second transparent resin layer is preferably 500 nm or less and is more preferably 110 nm or less. The film thickness of the second transparent resin layer is preferably 20 nm or more. The film thickness of the second transparent resin layer is particularly preferably 55 to 100 nm, more particularly preferably 60 to 100 nm, and still more particularly preferably 70 to 100 nm.

(Composition)

The transfer film of the present invention may be a negative-type material or a positive-type material.

In a case in which the transfer film of the present invention is a negative-type material, the second transparent resin layer preferably includes metal oxide particles, a binder resin (preferably an alkali-soluble resin), a photopolymerizable compound, and a polymerization initiator. Furthermore, additives and the like can be used, but components in the layer are not limited thereto.

In the transfer film of the present invention, the second transparent resin layer preferably includes a polymer binder, a photopolymerizable compound, and a photopolymerization initiator.

The method for controlling the refractive index of the second transparent resin layer is not particularly limited, and it is possible to singly use a transparent resin layer having a desired refractive index, use a transparent resin layer to which particles such as metal particles or metal oxide particles are added, or use a complex of a metal salt and a high molecule.

Furthermore, in the second transparent resin layer, additives may be used. Examples of the additives include the surfactants described in Paragraph 0017 of JP4502784B and Paragraphs 0060 to 0071 of JP2009-237362A, the thermal polymerization inhibitors described in Paragraph 0018 of JP4502784B, and, furthermore, other additives described in Paragraphs 0058 to 0071 of JP2000-310706A.

Hitherto, a case in which the transfer film of the present invention is a negative-type material has been mainly described, but the transfer film of the present invention may be a positive-type material. In a case in which the transfer film of the present invention is a positive-type material, for example, the material and the like described in JP2005-221726A are used in the second transparent resin layer, but components are not limited thereto.

—Ammonium Salt of Monomer having Acidic Group or Ammonium Salt of Resin having Acidic Group—

The second transparent resin layer preferably includes an ammonium salt of a monomer having an acidic group or an ammonium salt of a resin having an acidic group.

The ammonium salt of a monomer having an acidic group or the ammonium salt of a resin having an acidic group is not particularly limited.

The ammonium salt of a monomer having an acidic group or the ammonium salt of a resin having an acidic group in the second transparent resin layer is preferably an ammonium salt of an acrylic monomer or an acrylic resin having an acidic group.

The method for manufacturing the transfer film preferably includes a step of preparing a water-based resin composition including a monomer or a resin obtained by dissolving the monomer having an acidic group or the resin having an acidic group in an ammonia aqueous solution and turning at least some of the acidic group into an ammonium salt.

—Resin Having Acidic Group—

The monomer having an acidic group or the resin having an acidic group is preferably a resin having an acidic group and more preferably a resin having a monovalent acidic group (a carboxyl group or the like). The binder polymer in the second transparent resin layer is particularly preferably a binder polymer having a carboxyl group.

The resin which is used for the second transparent resin layer and is soluble in water-based solvents (preferably water or solvent mixtures of a lower alcohol having 1 to 3 carbon atoms and water) is not particularly limited within the scope of the gist of the present invention and can be appropriately selected from well-known resins.

The resin having an acidic group that is used for the second transparent resin layer is preferably an alkali-soluble resin. The alkali-soluble resin can be appropriately selected from alkali-soluble resins which are linear organic macromolecular polymers and have at least one group that accelerates alkali solubility (that is, an acidic group: for example, a carboxyl group, a phosphoric acidic group, a sulfonic acidic group, or the like) in a molecule (preferably a molecule having an acrylic copolymer or a styrene-based copolymer as the main chain). Among these, alkali-soluble resins which are soluble in organic solvents and can be developed using a weak alkaline aqueous solution are more preferred. The acidic group is preferably a carboxyl group.

To the manufacturing of the alkali-soluble resin, it is possible to apply, for example, a method in which a well-known radical polymerization method is used. The polymerization conditions such as temperature, pressure, the kind and amount of radical initiators, and the kind of solvents in the case of manufacturing the alkali-soluble resin using a radical polymerization method can be easily set by those skilled in the art, and the conditions can also be experimentally determined.

The linear organic macromolecular polymer is preferably a polymer having a carboxylic acid in the side chain. Examples thereof include poly(meth)acrylic acids, methacrylic acid copolymers, acrylic acid copolymers, itaconic acid copolymers, crotonic acid copolymers, maleic acid copolymers such as styrene/maleic acid, partially-esterified maleic acid copolymers, and the like, which are respectively described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), JP1984-71048A (JP-S59-71048A), JP1971-2121A (JP-S46-2121A), and JP1981-40824B (JP-S56-40824B) and, furthermore, acidic cellulose derivatives having a carboxylic acid in the side chain such as carboxyalkyl cellulose and carboxyalkyl starch, polymers obtained by adding an acid anhydride to a polymer having a hydroxyl group, and the like, and, furthermore, macromolecular polymers having a reactive functional group such as a (meth)acryloyl group in the side chain are also preferred.

Among these, particularly, benzyl (meth)acrylate/(meth)acrylic acid copolymers or multicomponent copolymers made of benzyl (meth)acrylate/(meth)acrylic acid/other monomers are preferred.

Additionally, polymers obtained by copolymerizing 2-hydroxyethylmethacrylate are also useful. The amount of the polymer being mixed and used can be arbitrary.

Additionally, examples thereof include 2-hydroxypropyl (meth)acrylate/polystyrene macromonomer/benzyl methacrylate/methacrylic acid copolymers, 2-hydroxy-3-phenoxypropyl acrylate/polymethyl methacrylate macromonomer/benzyl methacrylate/methacrylic acid copolymers, 2-hydroxyethyl methacrylate/polystyrene macromonomer/methyl methacrylate/methacrylic acid copolymers, 2-hydroxyethyl methacrylate/polystyrene macromonomer/benzyl methacrylate/methacrylic acid copolymers, and the like which are described in JP1995-140654A (JP-H07-140654A).

Regarding the specific constitutional unit of the alkali-soluble resin, particularly, copolymers of (meth)acrylic acid and an additional monomer capable of being copolymerized with (meth)acrylic acid are preferred.

Examples of the additional monomer capable of being copolymerized with (meth)acrylic acid include alkyl (meth)acrylates, aryl (meth)acrylates, vinyl compounds, and the like. Here, hydrogen atoms in alkyl groups and aryl groups may be substituted with substituents.

Specific examples of alkyl (meth)acrylate and aryl (meth)acrylate include methyl (meth)acrylates, ethyl (meth)acrylates, propyl (meth)acrylates, butyl (meth)acrylates, isobutyl (meth)acrylates, pentyl (meth)acrylates, hexyl (meth)acrylates, octyl (meth)acrylates, phenyl (meth)acrylates, benzyl acrylates, tolyl acrylates, naphthyl acrylates, cyclohexyl acrylates, and the like.

In addition, examples of the vinyl compounds include styrene, α-methyl styrene, vinyl toluene, glycidyl methacrylate, acrylonitrile, vinyl acetate, N-vinyl pyrrolidone, tetrahydrofurfuryl methacrylate, polystyrene macromonomers, polymethyl methacrylate macromonomers, $CH_2=CR^1R^2$, $CH_2=C(R^1)(COOR^3)$ [here, $R^1$ represents a hydrogen atom or an alkyl group having 1 to 5 carbon atoms, $R^2$ represents an aromatic hydrocarbon ring having 6 to 10 carbon atoms, and $R^3$ represents an alkyl group having 1 to 8 carbon atoms or an aralkyl group having 6 to 12 carbon atoms.], and the like.

The additional monomer capable of being copolymerized with (meth)acrylic acid can be used singly or a combination of two or more monomers capable of being copolymerized with (meth)acrylic acid can be used. A preferred additional monomer capable of being copolymerized with (meth)acrylic acid is at least one monomer selected from $CH_2=CR^1R^2$, $CH_2=C(R^1)(COOR^3)$, phenyl (meth)acrylates, benzyl (meth)acrylates, and styrene and particularly preferably $CH_2=CR^1R^2$ and/or $CH_2=C(R^1)(COOR^3)$.

Additionally, examples thereof include resins having an ethylenic unsaturated double bond introduced into a linear macromolecule which is obtained by reacting a (meth)acrylic compound having a reactive functional group, cinnamic acid, or the like with the linear macromolecule having a substituent capable of reacting with this reactive functional group. Examples of the reactive functional group include a hydroxyl group, a carboxyl group, an amino group, and the like, and examples of the substituent capable of being reacted with this reactive functional group include an isocyanate group, an aldehyde group, an epoxy group, and the like.

Among these, acrylic resins having an acidic group are preferred as the resin having an acidic group. Meanwhile, in the present specification, acrylic resins refer to both methacrylic resins and acrylic resins, and, similarly, (meth)acrylic resins refers to methacrylic resins and acrylic resins.

—Monomer Having Acidic Group—

As the monomer having an acidic group, it is possible to preferably use an acrylic monomer such as (meth)acrylic acid or a derivative thereof or the following monomer.

Examples thereof include tri- or tetrafunctional radical polymerizable monomers (monomers obtained by introducing a carboxylic acid group into a pentaerythritol tri- and tetraacrylate [PETA] skeleton (acid value=80 to 120 mg-KOH/g)), penta- or hexafunctional radical polymerizable monomers (monomers obtained by introducing a carboxylic acid group into a dipentaerythritol penta- and hexaacrylate [DPHA] skeleton (acid value=25 to 70 mg-KOH/g)), and the like. Specific titles are not described, but difunctional alkali-soluble radical polymerizable monomers may also be used as necessary.

Additionally, it is possible to preferably use the monomers having an acidic group described in <0025> to <0030> of JP2004-239942A, the content of which is incorporated into the present invention.

Among these, acrylic monomers such as (meth)acrylic acids or derivatives thereof can be more preferably used.

Meanwhile, in the present specification, acrylic monomers refer to both methacrylic monomers and acrylic monomers.

—Other Binder Polymers—

Other binder polymers having no acidic group which can be used in the second transparent resin layer are not particularly limited, and it is possible to use binder polymers that can be used in organic solvent-based resin compositions that are used to form the photosensitive transparent resin layer.

—Polymerizable Compound—

The second transparent resin layer preferably includes a polymerizable compound such as the photopolymerizable compound or thermopolymerizable compound since the compound increases the strength or the like of films by being cured. The resin layer more preferably includes a photopolymerizable compound other than the monomer having an acidic group.

As the polymerizable compound that is used in the second transparent resin layer, it is possible to use the polymerizable compounds described in Paragraphs 0023 and 0024 of JP4098550B. Among these, pentaerythritol tetraacrylate, pentaerythritol triacrylate, and tetraacryaltes of pentaerythritol ethylene oxide (EO) adducts can be preferably used. These polymerizable compounds may be used singly or a plurality of polymerizable compounds may be used in combination. In a case in which a mixture of pentaerythritol tetraacrylate and pentaerythritol triacrylate is used, the percentage of pentaerythritol triacrylate is preferably 0% to 80% and more preferably 10% to 60% in terms of the mass ratio.

Specific examples of the photopolymerizable compound that is used in the second transparent resin layer include water-soluble polymerizable compounds represented by Structural Formula 1, pentaerythritol tetraacrylate mixtures (NK ester A-TMMT manufactured by Shin-Nakamura Chemical Co., Ltd., containing approximately 10% of triacrylate as an impurity), mixtures of pentaerythritol tetraacrylate and triacrylate (NK ester A-TMM3LM-N manufactured by Shin-Nakamura Chemical Co., Ltd., 37% triacrylate), mixtures of pentaerythritol tetraacrylate and triacrylate (NK ester A-TMM-3L manufactured by Shin-Nakamura Chemical Co., Ltd., 55% triacrylate), mixtures of pentaerythritol tetraacrylate and triacrylate (NK ester A-TMM3 manufactured by Shin-Nakamura Chemical Co., Ltd., 57% triacrylate), tetraacrylates of a pentaerythritol ethylene oxide (EO) adduct (KAYARAD RP-1040 manufactured by Nippon Kayaku Co., Ltd.), and the like.

As the photopolymerizable compound that is used in the second transparent resin layer, among these, it is possible to preferably use the water-soluble polymerizable compound represented by Structural Formula 1, a pentaerythritol tetraacrylate mixture (NK ester A-TMMT manufactured by Shin-Nakamura Chemical Co., Ltd.), a mixture of pentaerythritol tetraacrylate and triacrylate (NK ester A-TMM3LM-N manufactured by Shin-Nakamura Chemical Co., Ltd., 37% triacrylate), or a mixture of pentaerythritol tetraacrylate and triacrylate (NK ester A-TMM-3L manufactured by Shin-Nakamura Chemical Co., Ltd., 55% triacrylate) from the viewpoint of improving the reticulation of the transfer film.

Structural Formula (1)

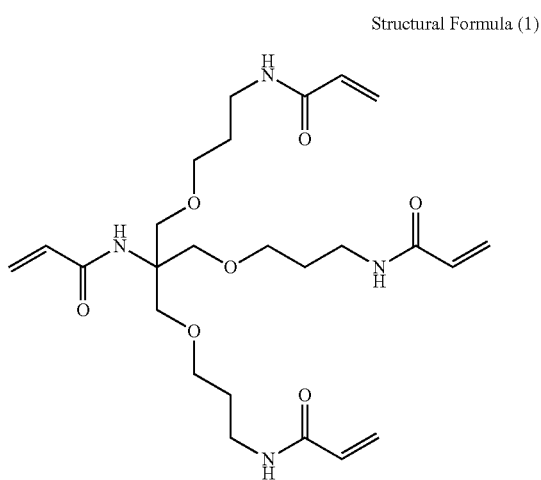

Regarding additional photopolymerizable compounds that are used in the second transparent resin layer, as polymerizable compounds that are soluble in water or solvent mixtures of a lower alcohol having 1 to 3 carbon atoms and water, it is possible to use monomers having a hydroxyl group and monomers having an ethylene oxide or polypropylene oxide and a phosphoric acid group in the molecule.

—Photopolymerization Initiator—

As the photopolymerization initiator which can be used for the second transparent resin layer and is soluble in water or solvent mixtures of a lower alcohol having 1 to 3 carbon atoms and water, it is possible to use IRGACURE 2959 or initiators of Structural Formula 2.

Structural Formula 2

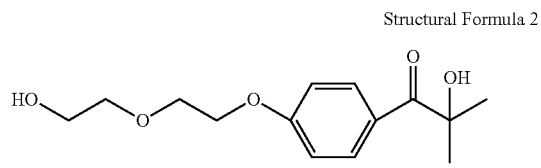 [SMILES: CC(C)(O)C(=O)c1ccc(OCCOCCO)cc1]

—Metal Oxide Particles—

The second transparent resin layer may or may not include particles (preferably metal oxide particles) for the purpose of adjusting the refractive index or the light transmittance, but preferably includes metal oxide particles from the viewpoint of controlling the refractive index of the second transparent resin layer in the above-described range. To the second transparent resin layer, it is possible to add metal oxide particles in an arbitrary ratio depending on the kind of the polymer or the polymerizable compound being used, and, in the second transparent resin layer, the content of the metal oxide particles is preferably 40% to 95% by mass, more preferably 55% to 95% by mass, particularly preferably 62% to 90% by mass from the viewpoint of improving cracks in the transfer film, more particularly preferably 62% to 75% by mass from the viewpoint of further improving cracks in the transfer film and improving the substrate adhesiveness of the laminate of the present invention, and still more particularly preferably 62% to 70% by mass of the second transparent resin layer.

The refractive index of the metal oxide particles is preferably higher than the refractive index of a composition made of a material obtained by removing the particles from the second transparent resin layer. Specifically, in the transfer film of the present invention, the second transparent resin layer more preferably contains particles having a refractive index of 1.50 or higher, still more preferably contains particles having a refractive index of 1.55 or higher, particularly preferably contains particles having a refractive index of 1.70 or higher, and most preferably contains particles having a refractive index of 1.90 or higher with respect to light rays having wavelengths of 400 to 750 nm.

Here, the refractive index being 1.50 or higher with respect to light rays having wavelengths of 400 to 750 nm means that the average refractive index is 1.50 or higher with respect to light having wavelengths in the above-described range, and the refractive index are not necessarily 1.50 or higher with respect to all of the light rays having wavelengths in the above-described range. In addition, the average refractive index refers to a value obtained by dividing the sum of the measurement values of the refractive index of individual light rays having wavelengths in the above-described range by the number of measurement points.

In addition, only one kind of the metal oxide particles may be used or two or more kinds of the metal oxide particles can be jointly used.

In the transfer film of the present invention, the second transparent resin layer preferably has at least one of $ZrO_2$ particles, $Nb_2O_5$ particles, or $TiO_2$ particles from the viewpoint of controlling the refractive index in the range of the refractive index of the second transparent resin layer, more preferably has $ZrO_2$ particles and $Nb_2O_5$ particles, and still more preferably has $ZrO_2$ particles.

<Thermoplastic Resin Layer>

In the transfer film of the present invention, it is also possible to provide a thermoplastic resin layer between the temporary support and the photosensitive transparent resin layer. In a case in which a laminate is formed by transferring the photosensitive transparent resin layer and the second transparent resin layer using a transfer material having the thermoplastic resin layer, air bubbles are not easily generated in individual elements formed by transferring the layers, image unevenness or the like is not easily caused in image display devices, and excellent display characteristics can be obtained.

The thermoplastic resin layer is preferably alkali-soluble. The thermoplastic resin layer plays a role of a cushion material so as to be capable of absorbing protrusions and recesses (also including protrusions, recesses, and the like caused by images and the like which have been previously formed) on the base surface and is preferably capable of transforming in accordance with protrusions and recesses on the subject surface.

The thermoplastic resin layer preferably includes the organic macromolecular substance described in JP1993-72724A (JP-H05-72724A) as a component and particularly preferably includes at least one substance selected from organic macromolecular substances having a softening point of approximately 80° C. or lower which is obtained using the Vicat method [specifically, the polymer softening point measurement method based on ASTM D1235].

Specific examples thereof include organic macromolecules such as polyolefins such as polyethylene and polypropylene, ethylene copolymers of ethylene and vinyl acetate or a saponified substance thereof, copolymers of ethylene and an acrylic acid ester or a saponified substance thereof, vinyl chloride copolymers of polyvinyl chloride or vinyl chloride and vinyl acetate or a saponified substance thereof, polyvinylidene chloride, vinylidene chloride copolymers, polystyrene, styrene copolymers of styrene and a (meth)acrylic acid ester or a saponified substance thereof, polyvinyl toluene, vinyl toluene copolymers of vinyl toluene and a (meth)acrylic acid ester or a saponified substance thereof, poly(meth)acrylic acid esters, (meth)acrylic acid ester copolymers of butyl (meth)acrylate and vinyl acetate, polyamide resins such as vinyl acetate copolymer nylon, copolymerized nylon, N-alkoxymethylated nylon, and N-dimethylaminated nylon, and the like.

The layer thickness of the thermoplastic resin layer is preferably 3 to 30 μm. In a case in which the layer thickness of the thermoplastic resin layer is less than 3 μm, there are cases in which followability during lamination is insufficient and protrusions and recesses on the base surface cannot be fully absorbed. In addition, in a case in which the layer thickness exceeds 30 μm, there are cases in which loads are applied to drying (solvent removal) during the formation of the thermoplastic resin layer on the temporary support, time is taken for the development of the thermoplastic resin layer, and the process suitability is deteriorated. The layer thickness of the thermoplastic resin layer is more preferably 4 to 25 μm and particularly preferably 5 to 20 μm.

The thermoplastic resin layer can be formed by means of the application or the like of a prepared liquid including a thermoplastic organic macromolecule, and the prepared liquid that is used in the case of application or the like can be prepared using a solvent. The solvent is not particularly limited as long as the solvent is capable of dissolving macromolecular components constituting the thermoplastic resin layer, and examples thereof include methyl ethyl ketone, cyclohexanone, propylene glycol monomethyl ether acetate, n-propanol, 2-propanol, and the like.

(Viscosities of Thermoplastic Resin Layer and Photocurable Resin Layer)

It is preferable that the viscosity of the thermoplastic resin layer measured at 100° C. is in a region of 1,000 to 10,000 Pa·sec and the viscosity of the photocurable resin layer measured at 100° C. is in a region of 2,000 to 50,000 Pa·sec.

<Interlayer>

In the transfer film of the present invention, it is also possible to provide an interlayer between the thermoplastic resin layer and the photosensitive transparent resin layer. The interlayer is described in JP1993-72724A (JP-H05-72724A) as "separation layer".

<Protective Film>

The transfer film of the present invention is preferably further provided with a protective film (hereinafter, also referred to as the "protective peeling layer") or the like on the surface of the second transparent resin layer.

As the protective film, it is possible to appropriately use the protective film described in Paragraphs 0083 to 0087 and 0093 of JP2006-259138A.

Figure 12:
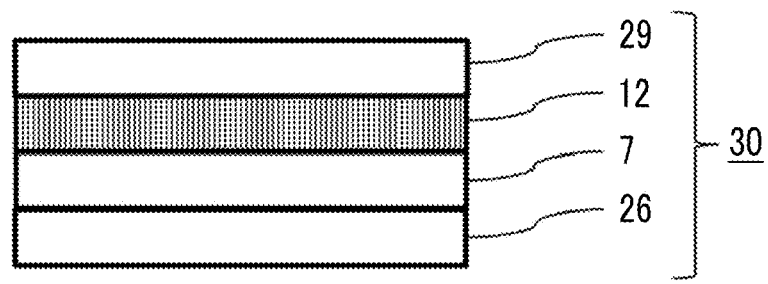
FIG. 12 is a schematic cross-sectional view illustrating an example of the constitution of the transfer film of the present invention.

FIG. 12 illustrates an example of a preferred constitution of the transfer film of the present invention. FIG. 12 is a schematic view of a transfer film 30 of the present invention in which a temporary support 26, a photosensitive transparent resin layer 7, the second transparent resin layer 12, and the protective peeling layer (protective film) 29 are laminated adjacent to each other in this order.

<Method for Manufacturing Transfer Film>

The method for manufacturing the transfer film is not particularly limited, and well-known methods can be used.

In a case in which the transfer film further having the second transparent resin layer in addition to the photosensitive transparent resin layer on the temporary support is manufactured, the method for manufacturing the above-described transfer film preferably includes a step of forming the photosensitive transparent resin layer on the temporary support and a step of forming the second transparent resin layer directly on the photosensitive transparent resin layer. The step of forming the photosensitive transparent resin layer is preferably a step of applying an organic solvent-based resin composition onto the temporary support. The step of forming the second transparent resin layer is preferably a step of applying a water-based resin composition including an ammonium salt of a monomer having an acidic group or an ammonium salt of a resin having an acidic group. When the above-described constitution is provided, the layers are favorably differentiated from each other. Furthermore, even in a case in which the transfer film is stored at a high temperature and a high humidity, problems caused by the absorption of moisture by transparent resin layers formed using a water-based resin composition can be suppressed.

When the water-based resin composition including an ammonium salt of a monomer having an acidic group or an ammonium salt of a resin having an acidic group is applied onto the photosensitive transparent resin layer obtained using the organic solvent-type resin composition, even in a case in which the second transparent resin layer is formed without curing the photosensitive transparent resin layer, interlaminar mixing does not occur, and layers are favorably differentiated from each other.

Furthermore, when coated film formed using the water-based resin composition including an ammonium salt of a monomer having an acidic group or an ammonium salt of a resin having an acidic group are dried, ammonia having a lower boiling point than water is likely to be volatilized from the ammonium salt of a monomer having an acidic group or the ammonium salt of a resin having an acidic group in the drying step. Therefore, it is possible to generate (regenerate) and provide acidic groups in the second transparent resin layer as the monomer having an acidic group or the resin having an acidic group. Therefore, in a case in which the transfer film is stored at a high temperature and a high humidity and moisture is absorbed, the monomer having an acidic group or the resin having an acidic group which constitutes the second transparent resin layer has already become insoluble in water, and thus it is possible to suppress problems caused when the transfer film absorbs moisture.

(Step of Forming Photosensitive Transparent Resin Layer on Temporary Support)

The method for manufacturing the transfer film has a step of forming the photosensitive transparent resin layer on the temporary support, and the step of forming the photosensitive transparent resin layer is preferably a step of applying an organic solvent-based resin composition onto the temporary support.

—Organic Solvent-Based Resin Composition—

The organic solvent-based resin composition refers to a resin composition that is soluble in organic solvents.

As the organic solvents, ordinary organic solvents can be used. Examples of the organic solvents include methyl ethyl ketone, propylene glycol monomethyl ether, propylene glycol monomethyl ether acetate, cyclohexanone, methyl isobutyl ketone, ethyl lactate, methyl lactate, caprolactam, and the like.

In the method for manufacturing the transfer film, the organic solvent-based resin composition that is used to form the photosensitive transparent resin layer preferably includes a binder polymer, a photopolymerizable compound, and a photopolymerization initiator.

(Step of Forming Second Transparent Resin Layer)

The method for manufacturing the transfer film has a step of forming the second transparent resin layer directly on the photosensitive transparent resin layer, and the step of forming the second transparent resin layer is preferably a step of applying a water-based resin composition including an ammonium salt of a monomer having an acidic group or an ammonium salt of a resin having an acidic group.

—Water-Based Resin Composition—

The water-based resin composition refers to a resin composition that is soluble in water-based solvents.

The water-based solvent is preferably water or a solvent mixture of a lower alcohol having 1 to 3 carbon atoms and water. In a preferred aspect of the method for manufacturing the transfer film, a solvent in the water-based resin composition used to form the second transparent resin layer preferably includes water and an alcohol having 1 to 3 carbon atoms and more preferably includes water or a solvent mixture in which the content ratio of water to the alcohol having 1 to 3 carbon atoms is 58/42 to 100/0 in terms of the mass ratio.

The content ratio of water to the alcohol having 1 to 3 carbon atoms is particularly preferably in a range of 59/41 to 100/0 in terms of the mass ratio, more particularly preferably 60/40 to 97/3 from the viewpoint of improving the coloration of the laminate of the present invention, more particularly preferably 62/38 to 95/5 from the viewpoint of improving the substrate adhesiveness of the laminate of the present invention, and most preferably 62/38 to 85/15.

Water, a solvent mixture of water and methanol, and a solvent mixture of water and ethanol are preferred, and a solvent mixture of water and methanol is preferred from the viewpoint of drying and coatability.

Particularly, in the case of forming the second transparent resin layer, in a case in which a solvent mixture of water and methanol is used, the mass ratio (in terms of % by mass) is preferably 58/42 to 100/0, more preferably in a range of 59/41 to 100/0, particularly preferably 60/40 to 97/3, more particularly preferably 62/38 to 95/5, and still more particularly preferably 62/38 to 85/15. In a case in which the content ratio of water to the alcohol having 1 to 3 carbon atoms in methanol becomes higher than a range of 58/42 in terms of mass ratio, the photosensitive transparent resin layer is dissolved or becomes white-turbide, which is not preferable.

When the content ratio is controlled to be in the above-described range, interlaminar mixing with the second transparent resin layer does not occur, and coating and rapid drying can be realized.

The power of hydrogen (pH) of the water-based resin composition at 25° C. is preferably 7.0 to 12.0, more preferably 7.0 to 10.0, and particularly preferably 7.0 to 8.5. The pH of the water-based resin composition can be adjusted to the above-described preferred range by, for example, adding the monomer having an acidic group or the resin having an acidic group to the acidic groups using an excess amount of ammonia.

In addition, in the method for manufacturing the transfer film, the water-based resin composition that is used to form the second transparent resin layer is preferably at least one of a heat-curable resin composition or a photocurable resin composition. In a case in which the photosensitive transparent resin layer and the second transparent resin layer are the above-described curable transparent resin layers, according to the method for manufacturing the transfer film, even when the photosensitive transparent resin layer is laminated, and then the second transparent resin layer is laminated without curing the photosensitive transparent resin layer, the layers are favorably differentiated from each other. Therefore, it is possible to further improve the visibility of the transparent electrode pattern. In addition, this constitution enables the development of the refractive index-adjusting layers (that is, the photosensitive transparent resin layer and the second transparent resin layer) in a desired pattern by means of photolithography after the refractive index-adjusting layers are transferred onto the transparent electrode pattern from the obtained transfer film (transfer material, preferably, transfer film).

In the method for manufacturing the transfer film, the water-based resin composition that is used to form the second transparent resin layer preferably has an ammonium salt of a monomer having an acidic group or an ammonium salt of a resin having an acidic group and includes a binder polymer, a photopolymerizable compound or thermopolymerizable compound, and photopolymerization initiator or thermopolymerization initiator. Only the ammonium salt of a resin having an acidic group may be used as the binder polymer, or, in addition to the ammonium salt of a resin having an acidic group, other binder polymers may be further jointly used. The ammonium salt of a monomer having an acidic group may be a photopolymerizable compound or thermopolymerizable compound, and, in addition to the ammonium salt of a monomer having an acidic group, a photopolymerizable compound or thermopolymerizable compound may be further jointly used.

<Volatilization of Ammonia>

Furthermore, the method for manufacturing the transfer film preferably includes a step of generating an acidic group by volatilizing ammonia from the ammonium salt of a monomer having an acidic group or the ammonium salt of a resin having an acidic group. The step of generating an acidic group is preferably a step of heating the coated water-based resin composition.

Preferred ranges of the detailed conditions of the step of heating the coated water-based resin composition will be described below.

As the heating and drying method, it is also possible to use a method in which the composition is passed through a furnace comprising a heating device or blasting. The heating and drying conditions may be appropriately set depending on organic solvents and the like being used, and the composition may be heated to a temperature of 40° C. to 150° C. Among these conditions, the composition is particularly preferably heated to a temperature of 50° C. to 120° C. and more preferably heated to a temperature of 60° C. to 100° C. In the heated and dried composition, the moisture content is preferably set to 5% by mass or less, more preferably set to 3% by mass or less, and still more preferably set to 1% by mass or less.

<Other Steps>

The method for manufacturing the transfer film may include a step of further forming a thermoplastic resin layer before the formation of the photosensitive transparent resin layer on the temporary support.

After the step of further forming the thermoplastic resin layer, a step of forming an interlayer between the thermoplastic resin layer and the photosensitive transparent resin layer may be provided. In the case of forming a photosensitive material having the interlayer, the photosensitive material can be preferably produced by applying and drying a solution obtained by dissolving additives together with a thermoplastic organic macromolecule (coating fluid for the thermoplastic resin layer) on the temporary support so as to provide a thermoplastic resin layer, then, applying and drying a preparation liquid obtained by adding resins or additives to a solvent that does not dissolve the thermoplastic resin layer (coating fluid for the interlayer) on the thermoplastic resin layer so as to laminate the interlayer thereon, and applying and drying a coating fluid for a photosensitive transparent resin layer prepared using a solvent that does not dissolve the interlayer onto this interlayer so as to laminate the photosensitive transparent resin layer.

As the method for manufacturing other transparent resin layers, it is possible to employ the method for producing a photosensitive transfer material described in Paragraphs 0094 to 0098 of JP2006-259138A.

[Electrode Protective Film for Electrostatic Capacitance-Type Input Device]

An electrode protective film for an electrostatic capacitance-type input device of the present invention is the transfer film of the present invention from which the temporary support is removed.

The electrode protective film for an electrostatic capacitance-type input device of the present invention is excellent in terms of both heat and moisture resistance after the supply of saline water and developability which are particularly important in the usages of electrostatic capacitance-type input devices.

The laminate of the present invention described below has the electrode protective film for an electrostatic capacitance-type input device of the present invention.

[Laminate]

A first aspect of the laminate of the present invention is a laminate formed by transferring the photosensitive transparent resin layer in the transfer film onto a substrate including an electrode of an electrostatic capacitance-type input device using the transfer film of the present invention.

A second aspect of the laminate of the present invention is a laminate having a substrate including an electrode of an electrostatic capacitance-type input device and a photosensitive transparent resin layer formed on the substrate, in which the photosensitive transparent resin layer includes a binder polymer, a photopolymerizable compound having an ethylenic unsaturated group, a photopolymerization initiator, and a blocked isocyanate, and the binder polymer is a carboxyl group-containing acrylic resin having an acid value of 60 mgKOH/g or more.

A third aspect of the laminate of the present invention is a laminate manufactured using the method for manufacturing a laminate of the present invention described below.

Since the laminates have the above-described constitutions, the laminate of the present invention is excellent in terms of both heat and moisture resistance after the supply of saline water and developability.

The electrode of the electrostatic capacitance-type input device may be a transparent electrode pattern or a guidance wire. In the laminate of the present invention, the electrode of the electrostatic capacitance-type input device is preferably an electrode pattern and more preferably a transparent electrode pattern.

The laminate of the present invention has a substrate including an electrode of an electrostatic capacitance-type input device and a photosensitive transparent resin layer formed on the substrate, preferably has at least a substrate, a transparent electrode pattern, or a photosensitive transparent resin layer, and more preferably has a substrate, a transparent electrode pattern, a second transparent resin layer disposed adjacent to the transparent electrode pattern, and a photosensitive transparent resin layer disposed adjacent to the second transparent resin layer.

The laminate of the present invention has a substrate, a transparent electrode pattern, a second transparent resin layer disposed adjacent to the transparent electrode pattern, and a photosensitive transparent resin layer disposed adjacent to the second transparent resin layer, in which the refractive index of the second transparent resin layer is particularly preferably higher than the refractive index of the photosensitive transparent resin layer, and the refractive index of the second transparent resin layer is more particularly preferably 1.6 or higher. When the above-described constitution is provided, it is possible to solve problems of the transparent electrode pattern being visible, and patterning properties become favorable.

<Constitution of Laminate>

The laminate of the present invention preferably further has a transparent film having a refractive index of 1.6 to 1.78 and a film thickness of 55 to 110 nm on a side of the transparent electrode pattern opposite to the side on which the second transparent resin layer is formed from the viewpoint of further improving the visibility of the transparent electrode pattern. Meanwhile, in the present specification, in the case of being simply mentioned, "transparent films" refer to the "transparent film having a refractive index of 1.6 to 1.78 and a film thickness of 55 to 110 nm".

The laminate of the present invention preferably further has a transparent substrate on a side of the transparent film opposite to the side on which the transparent electrode pattern is formed.

Figure 11:
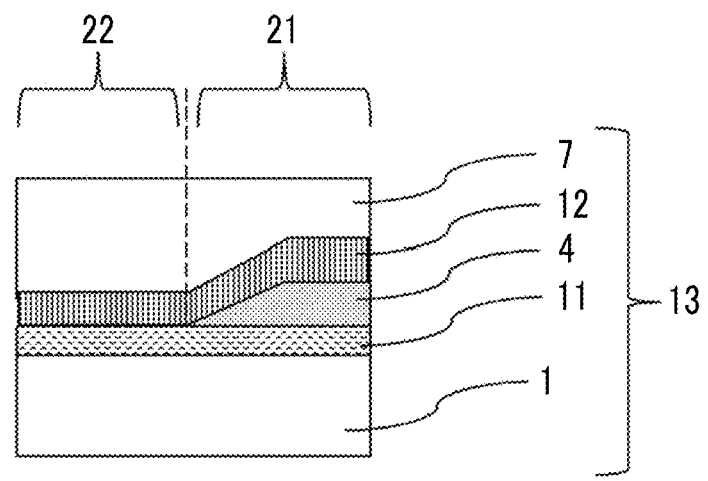
FIG. 11 is a schematic cross-sectional view illustrating an example of a constitution of a laminate of the present invention.

FIG. 11 illustrates an example of the constitution of the laminate of the present invention.

In FIG. 11, a transparent substrate 1 and a transparent film 11 having a refractive index of 1.6 to 1.78 and a film thickness of 55 to 110 nm are provided, and, furthermore, a region 21 in which a transparent electrode pattern 4, the second transparent resin layer 12, and the photosensitive transparent resin layer 7 are laminated in this order is provided in the plane. In addition, FIG. 11 illustrates that the laminate includes, in addition to the above-described region, a region in which the transparent substrate 1 and a transparent film 11 including at least two transparent thin films having different refractive indexes are laminated in this order (in the constitution of FIG. 11, a region 22 in which the second transparent resin layer 12 and the photosensitive transparent resin layer 7 are laminated in this order (that is, a non-patterned region 22 in which the transparent electrode pattern is not formed)).

In other words, the transparent electrode-patterned substrate includes the region 21 in which the transparent substrate 1, the transparent film 11 including at least two transparent thin films having different refractive indexes, the transparent electrode pattern 4, the second transparent resin layer 12, and the photosensitive transparent resin layer 7 are laminated in this order in the in-plane direction.

The in-plane direction refers to a direction that is substantially parallel to a surface parallel to the transparent substrate in the laminate. Therefore, the fact that the region in which the transparent electrode pattern 4, the second transparent resin layer 12, and the photosensitive transparent resin layer 7 are laminated in this order is included in the in-plane direction means that the orthogonal projection of the region in which the transparent electrode pattern 4, the second transparent resin layer 12, and the photosensitive transparent resin layer 7 are laminated in this order on the surface parallel to the transparent substrate in the laminate is present in a plane parallel to the transparent substrate in the laminate.

Figure 3:
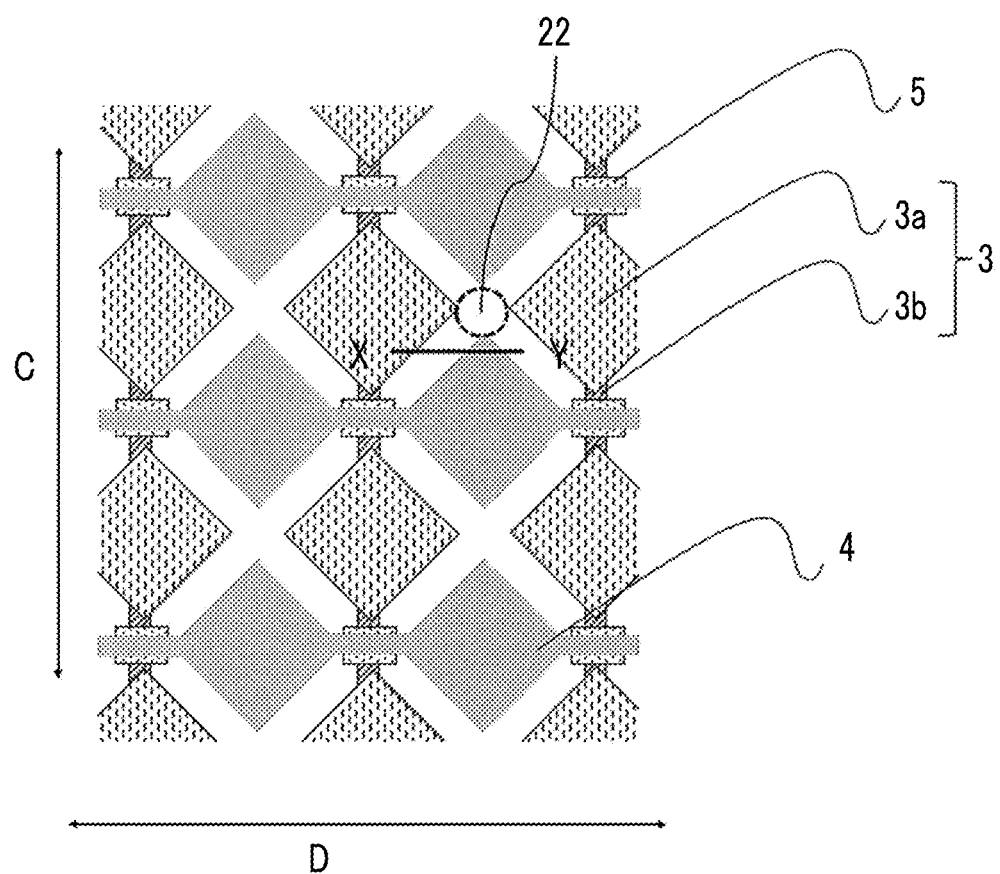
FIG. 3 is an explanatory view illustrating an example of a relationship between a transparent electrode pattern and non-patterned regions in the present invention.

Here, in a case in which the laminate of the present invention is used in an electrostatic capacitance-type input device described below, there are cases in which the transparent electrode pattern is provided in two substantially orthogonal directions that are the row direction and the column direction as a first transparent electrode pattern and a second transparent electrode pattern (for example, refer to FIG. 3). For example, in the constitution of FIG. 3, the transparent electrode pattern in the laminate of the present invention may be the second transparent electrode pattern 4 or a pad portion 3a of a first transparent electrode pattern 3. In other words, in the following description of the laminate of the present invention, there are cases in which the transparent electrode pattern is representatively indicated using a reference sign "4", but the application of the transparent electrode pattern in the laminate of the present invention is not limited to the second transparent electrode pattern 4 in the electrostatic capacitance-type input device of the present invention, and the transparent electrode pattern may be used as the pad portion 3a of the first transparent electrode pattern 3.

The laminate of the present invention preferably includes a non-patterned region in which the transparent electrode pattern is not formed. In the present specification, the non-patterned region refers to a region in which the transparent electrode pattern 4 is not formed.

FIG. 11 illustrates an aspect in which the laminate of the present invention includes the non-patterned region 22.

The laminate of the present invention preferably includes the region in which the transparent substrate, the transparent film, and the second transparent resin layer are laminated in this order in the plane at least in a part of the non-patterned region 22 in which the transparent electrode pattern is not formed.

In the laminate of the present invention, in the region in which the transparent substrate, the transparent film, and the second transparent resin layer are laminated in this order, the transparent film and the second transparent resin layer are preferably adjacent to each other.

In the other region of the non-patterned region 22, other members may be disposed in arbitrary locations within the scope of the gist of the present invention, and, for example, in a case in which the laminate of the present invention is used in the electrostatic capacitance-type input device described below, it is possible to laminate a mask layer 2, an insulating layer 5, a conductive element 6, and the like in FIG. 1A.

In the laminate of the present invention, the transparent substrate and the transparent film are preferably adjacent to each other.

FIG. 11 illustrates an aspect in which the transparent film 11 is adjacently laminated on the transparent substrate 1.

Within the scope of the gist of the present invention, a third transparent film may be laminated between the transparent substrate and the transparent film. For example, a third transparent film having a refractive index of 1.5 to 1.52 (not illustrated in FIG. 11) is preferably provided between the transparent substrate and the transparent film.

In the laminate of the present invention, the thickness of the transparent film is preferably 55 to 110 nm, more preferably 60 to 110 nm, and particularly preferably 70 to 90 nm.

Here, the transparent film may have a monolayer structure or a laminate structure of two or more layers. In a case in which the transparent film has a laminate structure of two or more layers, the film thickness of the transparent film refers to the total film thickness of all the layers.

In the laminate of the present invention, the transparent film and the transparent electrode pattern are preferably adjacent to each other.

FIG. 11 illustrates an aspect in which the transparent electrode pattern 4 is adjacently laminated on a region of a part of the transparent film 11.

As illustrated in FIG. 11, the shape of the end portion of the transparent electrode pattern 4 is not particularly limited and may be a taper shape, and, for example, the end portion may have a taper shape in which the surface on the transparent substrate side is wider than the surface on the side opposite to the transparent substrate.

Here, when the end portion of the transparent electrode pattern has a taper shape, the angle of the end portion of the transparent electrode pattern (hereinafter, also referred to as the taper angle) is preferably 30° or less, more preferably 0.1° to 15°, and particularly preferably 0.5° to 5°.

In the present specification, the taper angle can be obtained using the following method for measuring the taper angle: a microscopic photograph of the end portion of the transparent electrode pattern is captured, the taper portion in the microscopic photograph is approximated to a triangle, and the taper angle is directly measured.

Figure 10:
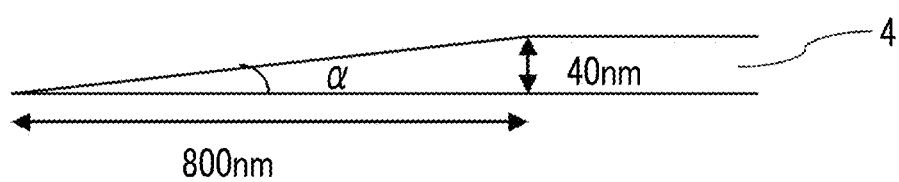
FIG. 10 is an explanatory view illustrating an example of a taper shape of an end portion of the transparent electrode pattern.

FIG. 10 illustrates an example of a case in which the end portion of the transparent electrode pattern has a taper shape. In a triangle obtained by approximating a taper portion in FIG. 10, the bottom surface is 800 nm, the height (the film thickness at the top portion substantially parallel to the bottom surface) is 40 nm, and the taper angle a at this time is approximately 3°. The bottom surface of the triangle obtained by approximating the taper portion is preferably 10 to 3,000 nm, more preferably 100 to 1,500 nm, and particularly preferably 300 to 1,000 nm.

Meanwhile, a preferred range of the height of the triangle obtained by approximating the taper portion is the same as the preferred range of the film thickness of the transparent electrode pattern.

The laminate of the present invention preferably includes a region in which the transparent electrode pattern and the second transparent resin layer are adjacent to each other.

FIG. 11 illustrates an aspect in which the transparent electrode pattern, the second transparent resin layer, and the photosensitive transparent resin layer are adjacent to each other in the region 21 in which the transparent electrode pattern, the second transparent resin layer, and the photosensitive transparent resin layer are laminated in this order.

In addition, in the laminate of the present invention, both of the transparent electrode pattern and the non-patterned region 22 in which the transparent electrode pattern is not formed are preferably continuously coated with the transparent film and the second transparent resin layer directly or through other layers.

Here, "being continuously coated" means that the transparent film and the second transparent resin layer are not patterned films but continuous films. That is, the transparent film and the second transparent resin layer preferably have no opening portions since the transparent electrode pattern is made to be rarely visible.

In addition, the transparent electrode pattern and the non-patterned region 22 are more preferably directly coated with the transparent film and the second transparent resin layer than coated through other layers. In a case in which the transparent electrode pattern and the non-patterned region are coated through other layers, examples of "other layers" include the insulating layer 5 included in the electrostatic capacitance-type input device of the present invention described below, a transparent electrode pattern on the second layer in a case in which two or more transparent electrode patterns are included as in the electrostatic capacitance-type input device of the present invention described below, and the like.

FIG. 11 illustrates an aspect in which the second transparent resin layer 12 is laminated. The second transparent resin layer 12 is laminated so as to astride the region in which the transparent electrode pattern 4 on the transparent film 11 is not laminated and the region in which the transparent electrode pattern 4 is laminated. That is, the second transparent resin layer 12 is adjacent to the transparent film 11 and, furthermore, the second transparent resin layer 12 is adjacent to the transparent electrode pattern 4.

In addition, in a case in which the end portion of the transparent electrode pattern 4 has a taper shape, the second transparent resin layer 12 is preferably laminated along the taper shape (at the same slope as the taper angle).

FIG. 11 illustrates an aspect in which the photosensitive transparent resin layer 7 is laminated on the surface of the second transparent resin layer 12 on a side opposite to the surface on which the transparent electrode pattern is formed.

<Material of Laminate>

(Substrate)

In the laminate of the present invention, the substrate is preferably a glass substrate or a film substrate. The substrate is more preferably a transparent substrate. In the method for manufacturing the laminate of the present invention, the substrate is more preferably a transparent film substrate.

The refractive index of the substrate is particularly preferably 1.5 to 1.52.

The substrate may be constituted of a translucent substrate such as a glass substrate, and it is possible to use reinforced glass or the like represented by Corning's GORILLA glass. In addition, as the transparent substrate, it is possible to preferably use the materials used in JP2010-86684A, JP2010-152809A, and JP2010-257492A.

In a case in which a film substrate is used as the substrate, a film substrate causing no optical distortion or a film substrate having high transparency is more preferably used, specific examples of materials include transparent film substrates including polyethylene terephthalate (PET), polyethylene naphthalate, polycarbonate (PC), triacetyl cellulose (TAC), or a cycloolefine polymer (COP).

(Transparent Electrode Pattern)

The refractive index of the transparent electrode pattern is preferably 1.75 to 2.1.

The material of the transparent electrode pattern is not particularly limited, and well-known materials can be used. For example, it is possible to produce the transparent electrode pattern using a translucent conductive metal oxide film such as indium tin oxide (ITO) or indium zinc oxide (IZO). Examples of the above-described metal film include ITO films; metal films of Al, Zn, Cu, Fe, Ni, Cr, Mo, and the like; metal oxide films of $SiO_2$ and the like. In this case, the film thicknesses of the respective elements can be set to 10 to 200 nm. In addition, since amorphous ITO films are turned into polycrystalline ITO films by means of firing, it is also possible to reduce the electrical resistance. In addition, the first transparent electrode pattern 3, the second transparent electrode pattern 4, and the conductive element 6 described below can also be manufactured using a photosensitive film having a photocurable resin layer for which a conductive fiber is used. Additionally, in a case in which the first conductive pattern and the like are formed using ITO or the like, it is possible to refer to Paragraphs 0014 to 0016 of JP4506785B. Among these, the transparent electrode pattern is preferably an ITO film.

In the laminate of the present invention, the transparent electrode pattern is preferably an ITO film having a refractive index of 1.75 to 2.1.

(Photosensitive Transparent Resin Layer and Second Transparent Resin Layer)

The preferred ranges of the photosensitive transparent resin layer and the second transparent resin layer included in the laminate of the present invention are the same as the preferred ranges of the above-described photosensitive transparent resin layer and the above-described second transparent resin layer in the transfer film of the present invention.

Among these, in the laminate of the present invention, the photosensitive transparent resin layer preferably includes a carboxylic acid anhydride since the photosensitive transparent resin layer serves as the electrode protective film for an electrostatic capacitance-type input device which is excellent in terms of both heat and moisture resistance after the supply of saline water and developability. When the carboxyl group-containing resin in the photosensitive transparent resin layer is thermally crosslinked by adding the blocked isocyanate thereto, an increase in the three-dimensional crosslinking density, the anhydrization and hydrophobilization of the carboxyl group in the carboxyl group-containing resin, or the like contributes to the improvement of heat and moisture resistance after the supply of saline water.

The method for adding a carboxylic acid anhydride to the photosensitive transparent resin layer is not particularly limited, but a method in which at least a part of the carboxyl group-containing acrylic resin is turned into a carboxylic acid anhydride by heating the transferred photosensitive transparent resin layer is preferred. In addition, in a case in which at least one photopolymerizable compound having an ethylenic unsaturated group contains a carboxyl group, the carboxyl group-containing acrylic resin and the photopolymerizable compound having an ethylenic unsaturated group containing a carboxyl group may form a carboxylic acid anhydride, or photopolymerizable compounds having an ethylenic unsaturated group containing a carboxyl group may form a carboxylic acid anhydride.

(Transparent Film)

In the laminate of the present invention, the refractive index of the transparent film is preferably 1.60 to 1.78 and more preferably 1.65 to 1.74. Here, the transparent film may have a monolayer structure or a laminate structure of two or more layers. In a case in which the transparent film has a laminate structure of two or more layers, the refractive index of the transparent film refers to the refractive index of all the layers.

The material of the transparent film is not particularly limited as long as the above-described range of the refractive index is satisfied.

The preferred range of the material of the transparent film and the preferred range of the physical properties such as the refractive index are the same as the preferred ranges of those of the second transparent resin layer.

In the laminate of the present invention, the transparent film and the second transparent resin layer are preferably constituted of the same material from the viewpoint of optical homogeneity.

In the laminate of the present invention, the transparent film is preferably a transparent resin film.

Metal oxide particles, resins (binders), and other additives that are used in the transparent resin film are not particularly limited within the scope of the gist of the present invention, and it is possible to preferably use the resin and other additives that are used in the second transparent resin layer in the transfer film of the present invention.

In the laminate of the present invention, the transparent film may be an inorganic film. As the material that is used in the inorganic film, the materials that are used in the second transparent resin layer in the transfer film of the present invention can be preferably used.

(Third Transparent Film)

The refractive index of the third transparent film is preferably 1.50 to 1.55 since the refractive index is approximated to the refractive index of the transparent substrate and the visibility of the transparent electrode pattern improves and more preferably 1.50 to 1.52.

[Method for Manufacturing Laminate]

The method for manufacturing a laminate according to the present invention includes a step of transferring the photosensitive transparent resin layer in the transfer film onto the substrate including the electrodes of the electrostatic capacitance-type input device using the transfer film of the present invention.

The method for manufacturing the laminate preferably includes a step of laminating the second transparent resin layer and the photosensitive transparent resin layer of the transfer film of the present invention in this order on the transparent electrode pattern.

When the above-described constitution is provided, it is possible to collectively transfer the second transparent resin layer and the photosensitive transparent resin layer of the laminate and easily manufacture laminates having no problems of the transparent electrode pattern being visible with favorable productivity.

Meanwhile, the second transparent resin layer is formed on the transparent electrode pattern and, in the non-patterned region, on the transparent film directly or through other layers.

(Surface Treatment of Transparent Substrate)

In addition, in order to enhance the adhesiveness of the respective layers by means of lamination in the subsequent transfer step, it is possible to carry out a surface treatment on the noncontact surface of the transparent substrate (front plate) in advance. As the surface treatment, it is preferable to carry out a surface treatment using a silane compound (silane coupling treatment). A silane coupling agent is preferably an agent having a functional group that interacts with photosensitive resins. For example, an aqueous solution of 0.3% by mass of a silane coupling liquid ((N-β(aminoethyl) γ-aminopropyltrimethoxysilane), trade name: KBM603, manufactured by Shin-Etsu Chemical Co., Ltd.) is showered on the surface for 20 seconds, and the surface is cleaned by means of pure water showering. After that, a reaction is caused by means of heating. A heating tank may be used, and the reaction can also be accelerated by preliminarily heating the substrate using a laminator.

(Formation of Transparent Electrode Pattern)

The transparent electrode pattern can be formed on the transparent substrate or the transparent film using the method for forming the first transparent electrode pattern 3, the second transparent electrode pattern 4, and the additional conductive element 6 or the like in the description of the electrostatic capacitance-type input device of the present invention described below or the like, and a method in which a photosensitive film is used is preferred.

(Formation of Photosensitive Transparent Resin Layer and Second Transparent Resin Layer)

Examples of the method for forming the photosensitive transparent resin layer and the second transparent resin layer includes methods having a protective film-removing step of removing the protective film from the transfer film of the present invention, a transfer step of transferring the photosensitive transparent resin layer and the second transparent resin layer in the transfer film of the present invention from which the protective film has been removed onto the transparent electrode pattern, an exposure step of exposing the photosensitive transparent resin layer and the second transparent resin layer which have been transferred onto the transparent electrode pattern, and a development step of developing the photosensitive transparent resin layer and the second transparent resin layer which have been exposed.

—Transfer Step—

The transfer step is preferably a step of transferring the photosensitive transparent resin layer and the second transparent resin layer in the transfer film of the present invention from which the protective film has been removed onto the transparent electrode pattern.

In this case, a method including a step of removing the base material (temporary support) after laminating the photosensitive transparent resin layer and the second transparent resin layer in the transfer film of the present invention on the transparent electrode pattern is preferred.

The photosensitive transparent resin layer and the second transparent resin layer are transferred (attached) onto the surface of the temporary support by overlaying, pressurizing, and heating the photosensitive transparent resin layer and the second transparent resin layer on the surface of the transparent electrode pattern. For the attachment, well-known devices such as a laminator, a vacuum laminator, and an auto-cut laminator capable of enhancing productivity can be used.

—Exposure Step, Development Step, and Other Steps—

As examples of the exposure step, the development step, and other steps, it is possible to preferably use the method described in Paragraphs 0035 to 0051 of JP2006-23696A even in the present invention.

The exposure step is a step of exposing the photosensitive transparent resin layer and the second transparent resin layer which have been transferred onto the transparent electrode pattern.

Specific examples thereof include a method in which a predetermined mask is disposed above the photosensitive transparent resin layer and the second transparent resin layer which has been formed on the transparent electrode patterns and then the photosensitive transparent resin layer and the second transparent resin layer are exposed above the mask through the mask and the temporary support.

Here, as the light sources for the exposure, it is possible to appropriately select and use light sources as long as the light sources are capable of radiating light having wavelengths in a range (for example, 365 nm, 405 nm, or the like) with which the photosensitive transparent resin layer and the second transparent resin layer can be cured. Specific examples thereof include an ultrahigh-pressure mercury lamp, a high-pressure mercury lamp, a metal halide lamp, and the like. The exposure amount is, generally, approximately 5 to 200 $mJ/cm^2$ and preferably approximately 10 to 100 $mJ/cm^2$.

The development step is a step of developing the exposed photocurable resin layer.

In the present invention, the development step is a narrowly-defined development step in which the photosensitive transparent resin layer and the second transparent resin layer which have been pattern-exposed are pattern-developed using a developer.

The development can be carried out using a developer. The developer is not particularly limited, and it is possible to use well-known developers such as the developer described in JP1993-72724A (JP-H05-72724A). Furthermore, the developer is preferably a developer in which photocurable resin layers perform dissolution-type development behaviors and, for example, preferably a developer including a compound having a pKa (power of Ka; Ka is the acid dissociation constant) of 7 to 13 at a concentration of 0.05 to 5 mol/L. Meanwhile, in a case in which the photosensitive transparent resin layer and the second transparent resin layer do not form any patterns, the developer is preferably a developer which performs development behaviors so as not to dissolve the non-alkali development-type coloring composition layer and, for example, preferably a developer including a compound having a pKa of 7 to 13 at a concentration of 0.05 to 5 mol/L. To the developer, a small amount of a water-miscible organic solvent may be further added. Examples of the water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, pentyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, N-methyl pyrrolidone, and the like. The concentration of the organic solvent is preferably 0.1% by mass to 30% by mass.

In addition, to the developer, it is possible to further add a well-known surfactant. The concentration of the surfactant is preferably 0.01% by mass to 10% by mass.

The development method may be any one of puddle development, shower development, shower and spin development, dip development, and the like. In the case of the shower development, a developer is showered onto the photosensitive transparent resin layer and the second transparent resin layer which have been exposed, whereby it is possible to remove non-cured portions. Furthermore, in a case in which the thermoplastic resin layer or the interlayer is provided, it is preferable to shower an alkaline liquid that does not easily dissolve photocurable resin layers to be developed and remove the thermoplastic resin layer, the interlayer, and the like. In addition, after the development, it is preferable to shower a cleaning agent or the like and remove development residue by rubbing the surface with a brush or the like. The liquid temperature of the developer is preferably 20° C. to 40° C., and the pH of the developer is preferably 8 to 13.

The method for manufacturing the laminate may have other steps such as a post exposure step.

Furthermore, patterning exposure or full-surface exposure may be carried out after the peeling of the base material (temporary support) or may be carried out before the peeling of the temporary support, which is followed by the peeling of the temporary support. The exposure may be exposure through a mask or digital exposure using a laser or the like.

—Heating Step—

The method for manufacturing a laminate of the present invention preferably includes a step of turning at least a part of the carboxyl group-containing acrylic resin into a carboxylic acid anhydride by heating the transferred photosensitive transparent resin layer from the viewpoint of enhancing heat and moisture resistance after the supply of saline water. The transferred photosensitive transparent resin layer is preferably heated after exposure and development, that is, the step is preferably a post-baking step carried out after exposure and development. In a case in which the photosensitive transparent resin layer and the second transparent resin layer are heat-curable, particularly, a post-baking step is preferably carried out. In addition, the post-baking step is preferably carried out from the viewpoint of adjusting the resistance value of transparent electrodes such as ITO.

The heating temperature in the step of turning at least a part of the carboxyl group-containing acrylic resin into a carboxylic acid anhydride by heating the transferred photosensitive transparent resin layer is preferably 100° C. to 160° C. in a case in which a film substrate is used as the substrate and more preferably 140° C. to 150° C.

(Formation of Transparent Film)

In a case in which the laminate of the present invention further has a transparent film having a refractive index of 1.6 to 1.78 and a film thickness of 55 to 110 nm on a side of the transparent electrode pattern opposite to the side on which the second transparent resin layer is formed, the transparent film is produced on the transparent electrode pattern directly or through other layers such as the third transparent film.

The method for forming the transparent film is not particularly limited, but the transparent film is preferably formed by means of transfer or sputtering.

Among these, the laminate of the present invention is preferably produced by transferring a transparent curable resin film having the transparent film formed on the temporary support onto the transparent substrate and more preferably produced by transferring and then curing the transparent curable resin film. Examples of the method for transferring and curing include a method in which the photosensitive film described in the section of the electrostatic capacitance-type input device of the present invention described below is used and transfer, exposure, development, and other steps are carried out in the same manner as in the method for transferring the photosensitive transparent resin layer and the second transparent resin layer in the method for manufacturing the laminate. In this case, the refractive index of the transparent film is preferably adjusted to the above-described range by dispersing the metal oxide particles in a photocurable resin layer in the photosensitive film.

Meanwhile, in a case in which the transparent film is an inorganic film, the transparent film is preferably formed by means of sputtering. That is, in the laminate of the present invention, the transparent film is also preferably formed by means of sputtering.

As the method for sputtering, it is possible to preferably use the method used in JP2010-86684A, JP2010-152809A, and JP2010-257492A.

(Formation of Third Transparent Film)

A method for forming the third transparent film is the same as a method for forming the transparent film having a refractive index of 1.6 to 1.78 and a film thickness of 55 to 110 nm on the transparent substrate.

The method for manufacturing the laminate preferably includes a step of curing the photosensitive transparent resin layer and the second transparent resin layer at the same time and more preferably includes a step of pattern-curing the layers at the same time. For the transfer film of the present invention, it is preferable to laminate the photosensitive transparent resin layer and then laminate the second transparent resin layer without curing the photosensitive transparent resin layer. The photosensitive transparent resin layer and the second transparent resin layer which have been transferred from the transfer film of the present invention obtained in the above-described manner can be cured at the same time. Therefore, the photosensitive transparent resin layer and the second transparent resin layer can be developed in a desired pattern by means of photolithography after being transferred onto the transparent electrode pattern from the transfer film of the present invention.

The method for manufacturing the laminate more preferably includes a step of developing and removing non-cured portions (in the case of photocuring, only non-exposed portions or only exposed portions) in the photosensitive transparent resin layer and the second transparent resin layer after the step of curing the photosensitive transparent resin layer and the second transparent resin layer at the same time.

[Electrostatic Capacitance-Type Input Device]

The electrostatic capacitance-type input device of the present invention includes the laminate of the present invention.

The electrostatic capacitance-type input device of the present invention is preferably produced by transferring the second transparent resin layer and the photosensitive transparent resin layer disposed adjacent to the second transparent resin layer onto the transparent electrode pattern in the electrostatic capacitance-type input device from the transfer film of the present invention.

The electrostatic capacitance-type input device of the present invention is preferably produced by curing the photosensitive transparent resin layer and the second transparent resin layer which have been transferred from the transfer film of the present invention at the same time and more preferably produced by pattern-curing the photosensitive transparent resin layer and the second transparent resin layer at the same time. Meanwhile, in a case in which the photosensitive transparent resin layer and the second transparent resin layer are cured at the same time, it is preferable not to peel the protective film from the transfer film of the present invention.

The electrostatic capacitance-type input device of the present invention is more preferably produced by developing and removing the non-cured portion of the photosensitive transparent resin layer and the second transparent resin layer which have been transferred from the transfer film of the present invention and pattern-cured at the same time. Meanwhile, it is preferable to cure the photosensitive transparent resin layer and the second transparent resin layer at the same time and then peel the protective film from the transfer film of the present invention before development. The electrostatic capacitance-type input device of the present invention needs to be connected to a flexible wire formed on a polyimide film at the terminal portion of a guidance wire, and thus this terminal portion is preferably not covered with the photosensitive transparent resin layer (and the second transparent resin layer).

Figure 13:
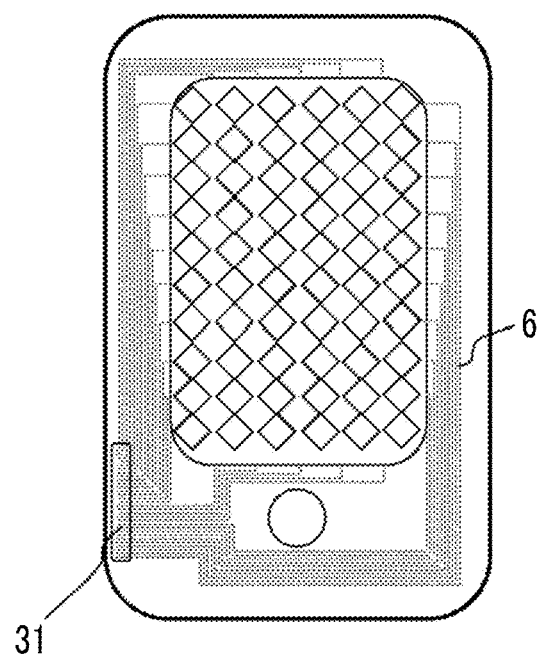
FIG. 13 is a top view illustrating another example of the constitution of the electrostatic capacitance-type input device of the present invention and illustrates an aspect including a terminal portion (end portion) of a guidance wire which is pattern-exposed and is not covered with a photosensitive transparent resin layer.

The above-described aspect is illustrated in FIG. 13. FIG. 13 illustrates an electrostatic capacitance-type input device having the following constitution which includes a guidance wire (the additional conductive element 6) of the transparent electrode pattern and a terminal portion 31 of the guidance wire.

The photosensitive transparent resin layer (and the second transparent resin layer) on the terminal portion 31 of the guidance wire forms a non-cured portion (non-exposed portion) and is thus removed by means of development, whereby the terminal portion 31 of the guidance wire is exposed.

Figure 14:
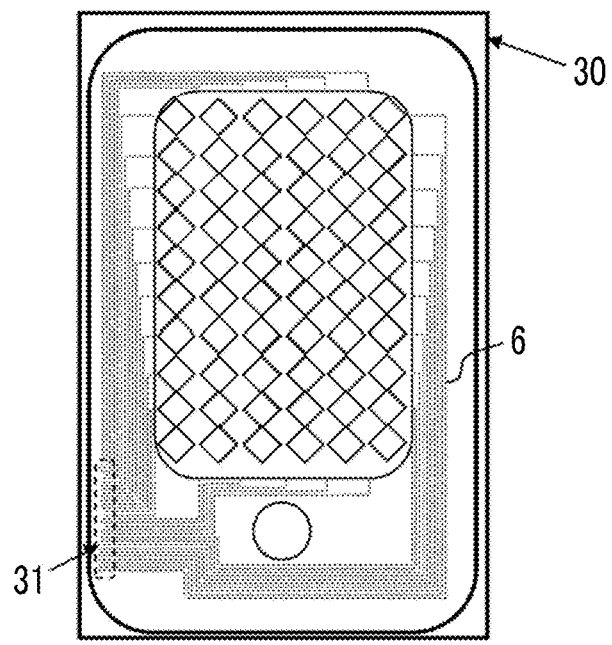
Figure 15:
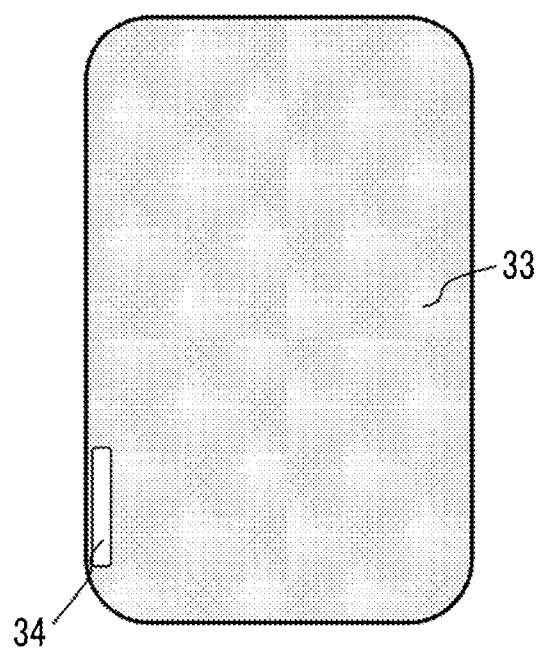
FIG. 15 is a schematic view illustrating an example of a desired pattern in which the photosensitive transparent resin layer and the second transparent resin layer are cured.

Specific exposure and development aspects are illustrated in FIGS. 14 and 15. FIG. 14 illustrates a state in which the transfer film 30 having the photosensitive transparent resin layer and the second transparent resin layer is laminated on the transparent electrode pattern in the electrostatic capacitance-type input device using a laminator and is to be cured by means of exposure or the like. In a case in which photolithography is used, that is, a case in which the transfer film is cured by means of exposure, the cured portion (exposed portion) 33 of the photosensitive transparent resin layer and the second transparent resin layer having a shape illustrated in FIG. 15 can be obtained by means of pattern exposure using a mask and the development of the non-exposed portions. Specifically, in FIG. 15, an opening portion 34 corresponding to the terminal portion of the guidance wire as the non-cured portion of the photosensitive transparent resin layer and the second transparent resin layer and the end portions of the photosensitive transparent resin layer and the second transparent resin layer which protrude outside the contour of the frame portion of the electrostatic capacitance-type input device are removed. A cured portion (desired pattern) of the photosensitive transparent resin layer and the second transparent resin layer for preventing the terminal portion (the ejection wire portion) of the guidance wire from being covered is formed.

Therefore, it is possible to directly connect the flexible wire produced on the polyimide film to the terminal portion 31 of the guidance wire, and it becomes possible to send signals from sensors to electric circuits.

The electrostatic capacitance-type input device of the present invention preferably has a laminate having the transparent electrode pattern, the second transparent resin layer disposed adjacent to the transparent electrode pattern, and the photosensitive transparent resin layer disposed adjacent to the second transparent resin layer, in which the refractive index of the second transparent resin layer is higher than the refractive index of the photosensitive transparent resin layer and the refractive index of the second transparent resin layer is 1.6 or higher.

Hereinafter, the detail of a preferred aspect of the electrostatic capacitance-type input device of the present invention will be described.

The electrostatic capacitance-type input device of the present invention has a front plate (corresponding to the transparent substrate in the laminate of the present invention) and at least the following elements (3) to (5), (7), or (8) on the noncontact surface side of the front plate and preferably has the laminate of the present invention:

(3) a plurality of first transparent electrode patterns in which a plurality of pad portions are formed so as to extend in a first direction through a connection portion;

(4) a plurality of second electrode patterns which are electrically insulated from the first transparent electrode patterns and are made of a plurality of pad portions formed so as to extend in a direction orthogonal to the above-described first direction;

(5) an insulating layer that electrically insulates the first transparent electrode pattern and the second electrode pattern;

(7) a second transparent resin layer formed so as to fully or partially cover the elements (3) to (5); and (8) a photosensitive transparent resin layer adjacently formed so as to cover the element (7).

Here, the second transparent resin layer (7) corresponds to the second transparent resin layer in the laminate of the present invention. In addition, the photosensitive transparent resin layer (8) corresponds to the photosensitive transparent resin layer in the laminate of the present invention. Meanwhile, generally, the photosensitive transparent resin layer is preferably a so-called transparent protective layer in well-known electrostatic capacitance-type input devices.

In the electrostatic capacitance-type input device of the present invention, the second electrode pattern (4) may or may not be a transparent electrode pattern but is preferably a transparent electrode pattern.

The electrostatic capacitance-type input device of the present invention preferably further has an additional conductive element other than the first transparent electrode pattern and the second electrode pattern which is electrically connected to at least one of the first transparent electrode pattern or the second electrode pattern (6).

Here, in a case in which the second electrode pattern (4) is not a transparent electrode pattern and the additional conductive element (6) is not provided, the first transparent electrode pattern (3) corresponds to the transparent electrode pattern in the laminate of the present invention.

In a case in which the second electrode pattern (4) is a transparent electrode pattern and the additional conductive element (6) is not provided, at least one of the first transparent electrode pattern (3) or the second electrode pattern (4) corresponds to the transparent electrode pattern in the laminate of the present invention.

In a case in which the second electrode pattern (4) is not a transparent electrode pattern and the additional conductive element (6) is provided, at least one of the first transparent electrode pattern (3) or the additional conductive element (6) corresponds to the transparent electrode pattern in the laminate of the present invention.

In a case in which the second electrode pattern (4) is a transparent electrode pattern and the additional conductive element (6) is provided, at least one of the first transparent electrode pattern (3), the second electrode pattern (4), or the additional conductive element (6) corresponds to the transparent electrode pattern in the laminate of the present invention.

The electrostatic capacitance-type input device of the present invention preferably further has the transparent film (2) between the first transparent electrode pattern (3) and the front plate, between the second electrode pattern (4) and the front plate, or between the additional conductive element (6) and the front plate. Here, the transparent film (2) preferably corresponds to the transparent film having a refractive index of 1.6 to 1.78 and a film thickness of 55 to 110 nm in the laminate of the present invention from the viewpoint of improving the visibility of the transparent electrode pattern.

The electrostatic capacitance-type input device of the present invention preferably has the mask layer (1) and/or a decorative layer as necessary. The mask layer is also provided as a black trim around a region touched by a finger, a stylus, or the like in order to prevent the guidance wire of the transparent electrode pattern from being visible from the touch side or decorate the input device. The decorative layer is provided as a trim around the region touched by a finger, a stylus, or the like in order for decoration, and, for example, a white decorative layer is preferably provided.

The mask layer (1) and/or the decorative layer are preferably provided between the transparent film (2) and the front plate, between the first transparent electrode pattern (3) and the front plate, between the second transparent electrode pattern (4) and the front plate, or between the additional conductive element (6) and the front plate. The mask layer (1) and/or the decorative layer are more preferably provided adjacent to the front plate.

Even in a case in which the electrostatic capacitance-type input device includes a variety of members described above, when the electrostatic capacitance-type input device of the present invention includes the second transparent resin layer disposed adjacent to the transparent electrode pattern and the photosensitive transparent resin layer disposed adjacent to the second transparent resin layer, it is possible to prevent the transparent electrode pattern from becoming visible and solve a problem of the visibility of the transparent electrode pattern. Furthermore, when a constitution in which the transparent electrode pattern is sandwiched using the transparent film having a refractive index of 1.6 to 1.78 and a film thickness of 55 to 110 nm and the second transparent resin layer as described above is provided, it is possible to further improve the problem of the visibility of the transparent electrode pattern.

<Constitution of Electrostatic Capacitance-Type Input Device>

First, a preferred constitution of the electrostatic capacitance-type input device of the present invention will be described together with methods for manufacturing the respective members constituting the device. FIG. 1A is a cross-sectional view illustrating a preferred constitution of the electrostatic capacitance-type input device of the present invention. FIG. 1A illustrates an aspect in which an electrostatic capacitance-type input device 10 is constituted of the transparent substrate (front plate) 1, the mask layer 2, the transparent film 11 having a refractive index of 1.6 to 1.78 and a film thickness of 55 to 110 nm, the first transparent electrode pattern 3, the second transparent electrode pattern 4, the insulating layer 5, the conductive element 6, the second transparent resin layer 12, and the photosensitive transparent resin layer 7.

In addition, FIG. 1B which illustrates a cross-sectional view in a direction of X-Y direction in FIG. 3 described below is also, similarly, a cross-sectional view illustrating a preferred constitution of the electrostatic capacitance-type input device of the present invention. FIG. 1B illustrates an aspect in which the electrostatic capacitance-type input device 10 is constituted of the transparent substrate (the front plate) 1, the transparent film 11 having a refractive index of 1.6 to 1.78 and a film thickness of 55 to 110 nm, the first transparent electrode pattern 3, the second transparent electrode pattern 4, the second transparent resin layer 12, and the photosensitive transparent resin layer 7.

For the transparent substrate (the front plate) 1, it is possible to use the materials exemplified as the material of the transparent electrode pattern in the laminate of the present invention. In addition, in FIG. 1A, the side of the front plate 1 on which the respective elements are provided will be referred to as the noncontact surface side. In the electrostatic capacitance-type input device 10 of the present invention, signals are input by touching the touch surface (the surface opposite to the noncontact surface) of the front plate 1 with a finger or the like.

In addition, the mask layer 2 is provided on the noncontact surface of the front plate 1. The mask layer 2 is a trim-shaped pattern around a display region formed on the noncontact surface side of a touch panel front plate and is formed in order to prevent the guidance wire and the like from being visible.

Figure 2:
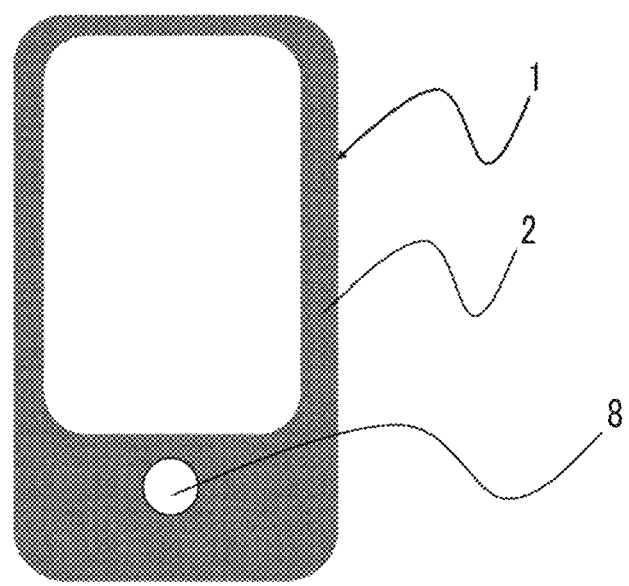
FIG. 2 is an explanatory view illustrating an example of a front plate in the present invention.

In the electrostatic capacitance-type input device 10, the mask layer 2 is provided so as to cover a part of the region (a region other than the input surface in FIG. 2) of the front plate 1 as illustrated in FIG. 2. Furthermore, an opening portion 8 can be provided in a part of the front plate 1 as illustrated in FIG. 2. In the opening portion 8, a press-type mechanical switch can be installed.

On the noncontact surface of the front plate 1, a plurality of first transparent electrode patterns 3 in which the plurality of pad portions are formed so as to extend in the first direction through the connection portions, a plurality of second transparent electrode patterns 4 which are electrically insulated from the first transparent electrode pattern 3 and are made of a plurality of pad portions formed so as to extend in a direction orthogonal to the first direction, and the insulating layer 5 that electrically insulates the first transparent electrode pattern 3 and the second transparent electrode pattern 4. For the first transparent electrode pattern 3, the second transparent electrode pattern 4, and the conductive element 6 described below, the materials exemplified as the material of the transparent electrode pattern in the laminate of the present invention can be used, and ITO films are preferred.

In addition, at least one of the first transparent electrode pattern 3 or the second transparent electrode pattern 4 can be installed so as to astride both regions of the noncontact surface of the front plate 1 and the surface of the mask layer 2 opposite to the front plate 1. FIG. 1A illustrates a view in which the second transparent electrode pattern is installed so as to astride both regions of the noncontact surface of the front plate 1 and the surface of the mask layer 2 opposite to the front plate 1.

As described above, even in a case in which a photosensitive film is laminated so as to astride the mask layer which requires a certain thickness and the noncontact surface of the front plate, when a photosensitive film having a specific layer constitution described below is used, lamination causing no generation of foam in the boundary with the mask portion becomes possible with a simple step without using an expensive facility such as a vacuum laminator.

The first transparent electrode pattern 3 and the second transparent electrode pattern 4 will be described using FIG. 3. FIG. 3 is an explanatory view illustrating an example of the first transparent electrode pattern and the second transparent electrode pattern in the present invention. As illustrated in FIG. 3, in the first transparent electrode pattern 3, the pad portions 3a are formed so as to extend in the first direction C through the connection portion 3b. In addition, the second transparent electrode pattern 4 is electrically insulated from the first transparent electrode pattern 3 using the insulating layer 5 and is constituted of the plurality of pad portions formed so as to extend in a direction orthogonal to the first direction (a second direction D in FIG. 3). Here, in a case in which the first transparent electrode pattern 3 is formed, the pad portions 3a and the connection portions 3b may be integrally produced or it is also possible to produce the connection portions 3b alone and integrally produce (pattern) the pad portions 3a and the second transparent electrode pattern 4. In a case in which the pad portions 3a and the second transparent electrode pattern 4 are integrally produced (patterned), the respective layers are formed so that some of the connection portions 3b and some of the pad portions 3a are coupled together as illustrated in FIG. 3 and the first transparent electrode pattern 3 and the second transparent electrode pattern 4 are electrically insulated from each other using the insulating layer 5.

In addition, in FIG. 3, a region in which the first transparent electrode pattern 3, the second transparent electrode pattern 4, or the conductive element 6 described below are not formed corresponds to the non-patterned region 22 in the laminate of the present invention.

Figure 1B:
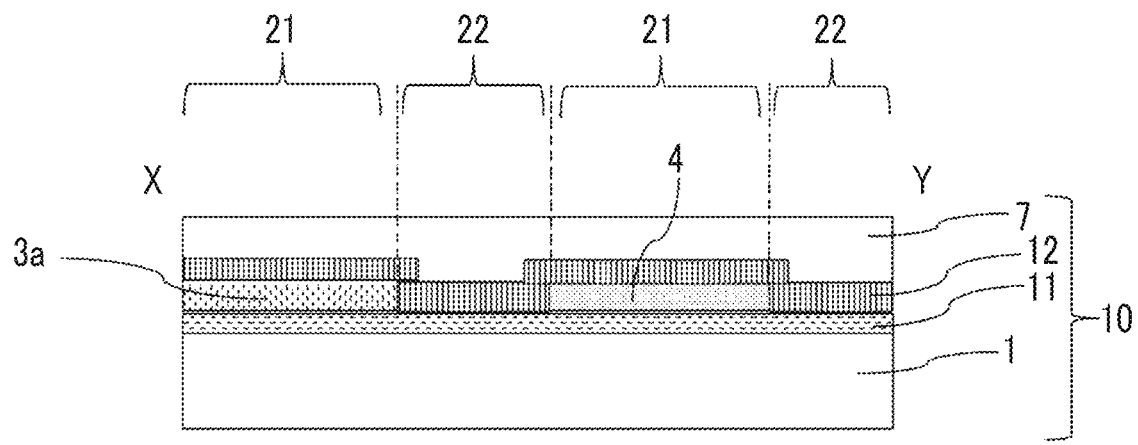
FIG. 1B is a schematic cross-sectional view illustrating another example of the constitution of the electrostatic capacitance-type input device of the present invention.

In FIG. 1A, the conductive element 6 is installed on the surface side of the mask layer 2 opposite to the front plate 1. The conductive element 6 is electrically connected to at least one of the first transparent electrode pattern 3 or the second transparent electrode pattern 4 and is a separate element from the first transparent electrode pattern 3 and the second transparent electrode pattern 4.

FIG. 1A illustrates a view in which the conductive element 6 is connected to the second transparent electrode pattern 4.

In addition, in FIG. 1A, the photosensitive transparent resin layer 7 is installed so as to cover all of the respective constituent elements. The photosensitive transparent resin layer 7 may be constituted so as to cover only part of the respective constituent elements. The insulating layer 5 and the photosensitive transparent resin layer 7 may be made of the same material or different materials. As the material constituting the insulating layer 5, it is possible to preferably use the material exemplified as the material of the first or second transparent resin layer in the laminate of the present invention.

<Method for Manufacturing Electrostatic Capacitance-Type Input Device>

Figure 4:
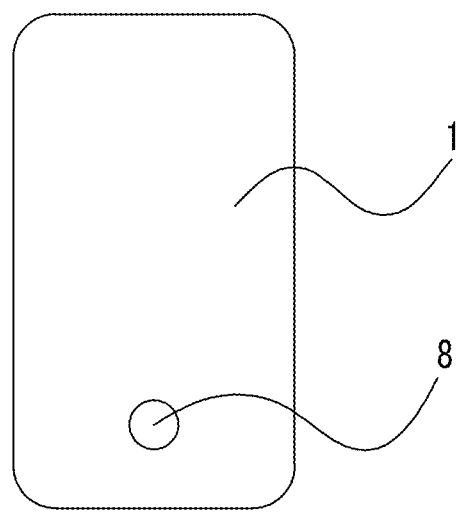
FIG. 4 is a top view illustrating an example of the front plate in which an opening portion is formed.
Figure 5:
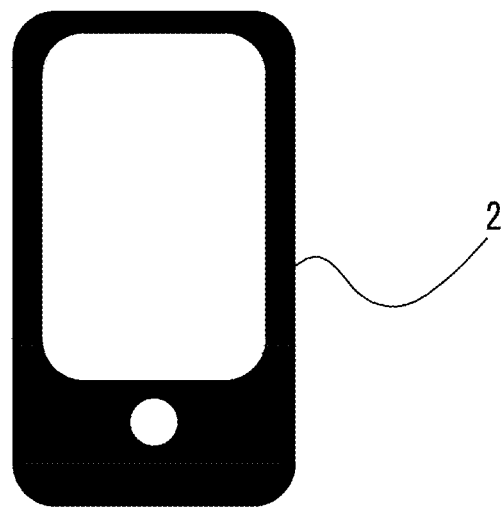
FIG. 5 is a top view illustrating an example of the front plate on which a mask layer is formed.
Figure 6:
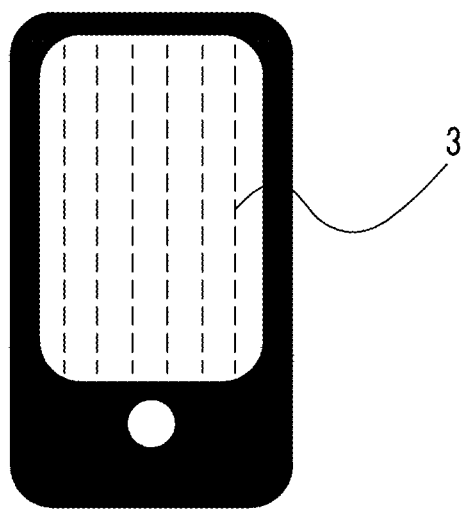
FIG. 6 is a top view illustrating an example of the front plate on which a first transparent electrode pattern is formed.
Figure 7:
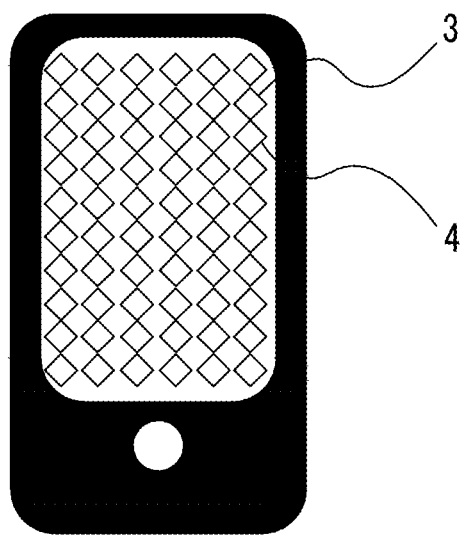
FIG. 7 is a top view illustrating an example of the front plate on which the first transparent electrode pattern and a second transparent electrode pattern are formed.
Figure 8:
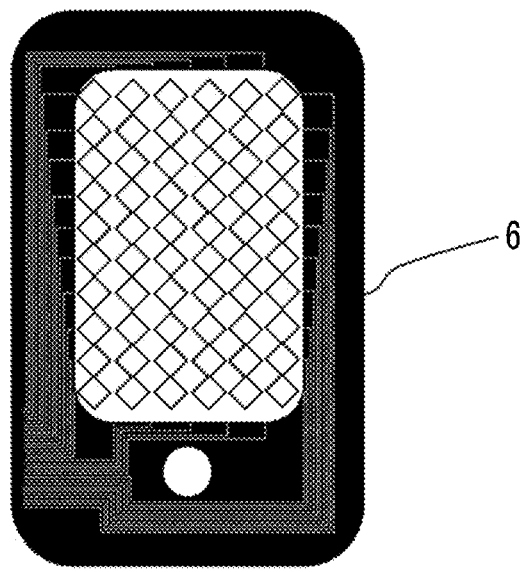
FIG. 8 is a top view illustrating an example of the front plate on which a conductive element different from the first and second transparent electrode patterns is formed.

Examples of an aspect being formed in a process for manufacturing the electrostatic capacitance-type input device of the present invention include aspects of FIGS. 4 to 8. FIG. 4 is a top view illustrating an example of the transparent front plate 1 in which the opening portion 8 is formed and which is made of reinforced glass. FIG. 5 is a top view illustrating an example of the front plate in which the mask layer 2 is formed. FIG. 6 is a top view illustrating an example of the front plate in which the first transparent electrode pattern 3 is formed. FIG. 7 is a top view illustrating an example of the front plate in which the first transparent electrode pattern 3 and the second transparent electrode pattern 4 are formed. FIG. 8 is a top view illustrating an example of the front plate in which the additional conductive element 6 other than the first and second transparent electrode patterns is formed. These aspects illustrate examples in which the following description is specified, and the scope of the present invention is not interpreted to be limited by these drawings.

In the method for manufacturing the electrostatic capacitance-type input device, in a case in which the second transparent resin layer 12 and the photosensitive transparent resin layer 7 are formed, the layers can be formed by transferring the second transparent resin layer and the photosensitive transparent resin layer onto the surface of the front plate 1 on which the respective elements are arbitrarily formed using the transfer film of the present invention.

In the method for manufacturing the electrostatic capacitance-type input device, at least one element of the mask layer 2, the first transparent electrode pattern 3, the second transparent electrode pattern 4, the insulating layer 5, or the conductive element 6 are preferably formed using the photosensitive film having the temporary support and the photocurable resin layer in this order.

In a case in which the respective elements are formed using the transfer film of the present invention or the photosensitive film, even in the substrate (the front plate) having the opening portion, resist components do not leak through the opening portion. Particularly, in the mask layer in which a light-blocking pattern needs to be formed up to immediately above the boundary line of the front plate, resist components do not protrude (leak) from the glass end, and thus the contamination of the rear side of the front plate is suppressed. Therefore, it is possible to manufacture touch panels having a reduced thickness and a reduced weight with simple steps.

In a case in which the mask layer, the insulating layer, and the conductive photocurable resin layer are used, in a case in which the permanent materials of the first transparent electrode pattern, the second transparent electrode pattern, the conductive element, and the like are formed using the photosensitive film, patterns can be obtained by laminating the photosensitive film on a base material, then, exposing the photosensitive film in a pattern shape as necessary, and removing the non-exposed portions in the case of a negative-type material or the exposed portions in the case of a positive-type material by means of a development treatment. In the development, the thermoplastic resin layer and the photocurable resin layer may be developed using separate fluids or may be removed using the same fluid. Well-known development facilities such as a brush and a high-pressure jet may be combined together as necessary. After the development, post exposure, post baking, and the like may be carried out as necessary.

(Photosensitive Film)

The photosensitive film other than the transfer film of the present invention which is preferably used to manufacture the electrostatic capacitance-type input device of the present invention will be described. The photosensitive film has a temporary support and a photocurable resin layer and preferably has a thermoplastic resin layer between the temporary support and the photocurable resin layer. In a case in which the mask layer and the like are formed using the photosensitive film having the thermoplastic resin layer, air bubbles are not easily generated in elements formed by transferring the photocurable resin layer. Therefore, image unevenness or the like is not easily caused in image display devices, and excellent display characteristics can be obtained.

The photosensitive film may be a negative-type material or a positive-type material.

—Layers Other Than Photocurable Resin Layer and Production Method—

As the temporary support and the thermoplastic resin layer in the photosensitive film, it is possible to respectively use the same temporary support and thermoplastic resin layer as those respectively used in the transfer film of the present invention. In addition, as the method for producing the photosensitive film, it is possible to use the same method as the method for manufacturing the transfer film.

—Photocurable Resin Layer—

In the photosensitive film, additives are added to the photocurable resin layer depending on the applications of the photosensitive film. That is, in a case in which the photosensitive film is used to form the mask layer, a colorant is added to the photocurable resin layer. In addition, in a case in which the photosensitive film has a conductive photocurable resin layer, a conductive fiber and the like are added to the photocurable resin layer.

In a case in which the photosensitive film is a negative-type material, the photocurable resin layer preferably includes an alkali-soluble resin, a polymerizable compound, and a polymerization initiator or a polymerization initiation system. Furthermore, conductive fibers, colorants, other additives, and the like are used, but the components are not limited thereto.

—Alkali-Soluble Resin, Polymerizable Compound, Polymerization Initiator or Polymerization Initiation System—

As the alkali-soluble resin, the polymerizable compound, the polymerization initiator or the polymerization initiation system included in the photosensitive film, it is possible to use the same alkali-soluble resin, polymerizable compound, polymerization initiator or polymerization initiation system as those used in the transfer film of the present invention.

—Conductive Fiber (in the Case of Being Used as Conductive Photocurable Resin Layer)—

In a case in which the photosensitive film on which the conductive photocurable resin layer is laminated is used to form the transparent electrode pattern or the additional conductive element, it is possible to use the following conductive fibers and the like in the photocurable resin layer.

The structure of the conductive fiber is not particularly limited and can be appropriately selected depending on the purposes, but is preferably any one of a solid structure and a hollow structure.

Here, there are cases in which a fiber having a solid structure will be referred to as a "wire" and a fiber having a hollow structure will be referred to as a "tube". In addition, there are cases in which a conductive fiber having an average short-axis length of 1 nm to 1,000 nm and an average long-axis length of 1 μm to 100 μm will be referred to as a "nanowire".

In addition, there are cases in which a conductive fiber having an average short-axis length of 1 nm to 1,000 nm, an average long-axis length of 0.1 μm to 1,000 μm, and a hollow structure will be referred to as a "nanotube".

The material of the conductive fiber is not particularly limited as long as the material is conductive and can be appropriately selected depending on the purposes, but at least one of metal or carbon is preferred, and, among these, the conductive fiber is particularly preferably at least one of metal nanowires, metal nanotubes, or carbon nanotubes.

The material of the metal nanowire is not particularly limited, and, for example, at least one metal selected from the group consisting of Groups 4, 5, and 6 of the extended periodic table (The International Union of Pure and Applied Chemistry (IUPAC) 1991) is preferred, at least one metal selected from Groups 2 to 14 is more preferred, at least one metal selected from Groups 2, 8, 9, 10, 11, 12, 13, and 14 is still more preferred, and materials including the above-described metal as a main component are particularly preferred.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, alloys thereof, and the like. Among these, metals mainly containing silver or metals containing an alloy of silver and a metal other than silver are preferred from the viewpoint of the excellent conductivity.

The "metals mainly containing silver" means that the content of silver in the metal nanowire is 50% by mass or more and preferably 90% by mass or more.

Examples of metals used to form the alloys with silver include platinum, osmium, palladium, iridium, and the like. These metals may be used singly or two or more metals may be jointly used.

The shape of the metal nanowire is not particularly limited, can be appropriately selected depending on the purposes, and may be, for example, an arbitrary shape such as a cylindrical shape, a cubic shape, or a column shape having a polygonal cross-section. In applications in which high transparency is required, a cylindrical shape or a cross-sectional shape in which the corners of the polygonal shape of the cross-section are rounded is preferred.

The cross-sectional shape of the metal nanowire can be investigated by applying a water dispersion liquid of the metal nanowire onto the base material and observing the cross-section using a transmission electron microscope (TEM).

Figure 9:
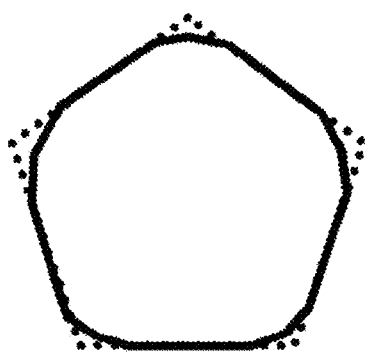
FIG. 9 is an explanatory view illustrating a cross-section of a metal nanowire.

The corner of the cross-section of the metal nanowire refers to a peripheral portion of a point at which a line extended from a side of the cross-section and a perpendicular line drawn from an adjacent side intersect each other. In addition, "a side of the cross-section" refers to a straight line connecting adjacent corners. In this case, the ratio of the "outer circumferential length of the cross-section" to the total length of "the respective sides of the cross-section" is considered as the degree of sharpness. For example, in the cross-section of a metal nanowire as illustrated in FIG. 9, the degree of sharpness can be represented by the ratio of the outer circumferential length of the cross-section indicated using a solid line to the outer circumferential length of a pentagon indicated using a dotted line. A cross-sectional shape having a degree of sharpness of 75% or less is defined as a cross-sectional shape with round corners. The degree of sharpness is preferably 60% or less and more preferably 50% or less. When the degree of sharpness exceeds 75%, there are cases in which yellow tone remains and thus transparency deteriorates. This is assumed to be because electrons are locally present in the corners and plasmon absorption increases. In addition, there are cases in which the linearity of edge portions of a pattern degrades and rattling is caused. The lower limit of the degree of sharpness is preferably 30% and more preferably 40%.

The average short-axis length (in some case, referred to as "average short-axis diameter" or "average diameter") of the metal nanowire is preferably 150 nm or less, more preferably 1 nm to 40 nm, still more preferably 10 nm to 40 nm, and particularly preferably 15 nm to 35 nm.

In a case in which the average short-axis length is less than 1 nm, oxidation resistance deteriorates, and there are cases in which durability deteriorates, and, in a case in which the average short-axis length exceeds 150 nm, the metal nanowire causes scattering, and there are cases in which sufficient transparency cannot be obtained.

The average short-axis length of the metal nanowire is obtained by observing 300 metal nanowires using a transmission electron microscope (TEM; manufactured by JEOL Ltd.; JEM-2000FX) and calculating the average value.

Meanwhile, in a case in which the short axis of the metal nanowire is not round, the longest axis is considered as the short-axis length.

The average long-axis length (in some cases, referred to as "average length") of the metal nanowire is preferably 1 µm to 40 µm, more preferably 3 µm to 35 µm, and still more preferably 5 µm to 30 µm.

When the average long-axis length is shorter than 1 µm, it is difficult to form dense networks, and there are cases in which sufficient conductivity cannot be obtained. When the average long-axis length exceeds 40 µm, the metal nanowires are too long and are thus tangled during manufacturing, and there are cases in which aggregates are generated in the manufacturing process.

The average long-axis length of the metal nanowire is obtained by, for example, observing 300 metal nanowires using a transmission electron microscope (TEM; manufactured by JEOL Ltd.; JEM-2000FX) and calculating the average value. Meanwhile, in a case in which the metal nanowire is bent, a circle including the bending of the metal nanowire as an arc is considered, and the value computed from the radius and curvature thereof is used as the long-axis length.

The layer thickness of the conductive photocurable resin layer is preferably 0.1 to 20 µm, more preferably 0.5 to 18 µm, and particularly preferably 1 to 15 µm from the viewpoint of the stability of coating fluids, drying during coating, and the development time during patterning.

The content of the conductive fiber in the total solid contents of the conductive photocurable resin layer is preferably 0.01% to 50% by mass, more preferably 0.05% to 30% by mass, and particularly preferably 0.1% to 20% by mass from the viewpoint of the conductivity and the stability of coating fluids.

—Colorant (in the Case of Being Used as Mask Layer)—

In a case in which the photosensitive film is used as the mask layer, it is possible to use a colorant in the photocurable resin layer. As the colorant that is used in the present invention, it is possible to preferably use well-known colorants (organic pigments, inorganic pigments, dyes, and the like). Furthermore, in the present invention, in addition to black colorants, mixtures of red pigments, blue pigments, green pigments, and the like can be used.

In a case in which the photocurable resin layer is used as a black mask layer, a black colorant is preferably included from the viewpoint of the optical density. Examples of the black colorant include carbon black, titanium carbon, iron oxide, titanium oxide, graphite, and the like, and, among these, carbon black is preferred.

In a case in which the photocurable resin layer is used as a white mask layer, it is possible to use the white pigments described in Paragraph 0015 or 0114 of JP2005-7765A. In order to use the photocurable resin layer as mask layers having other colors, the pigments or dyes described in Paragraphs 0183 to 0185 of JP4546276B may be mixed into the photocurable resin layer. Specifically, it is possible to preferably use the pigments and dyes described in Paragraphs 0038 to 0054 of JP2005-17716A, the pigments described in Paragraphs 0068 to 0072 of JP2004-361447A, the colorants described in Paragraphs 0080 to 0088 of JP2005-17521A, and the like.

The colorant (preferably a pigment and more preferably carbon black) is desirably used as a dispersion liquid. This dispersion liquid can be prepared by adding a composition obtained by mixing the colorant and a pigment dispersant in advance to an organic solvent described below (or a vehicle) and dispersing the composition in the organic solvent. The vehicle refers to a portion of a medium in which a pigment is dispersed when paint is in a liquid state and includes a liquid component (a binder) which is a liquid phase and bonded with the pigment so as to form coated films and a component that dissolves and dilutes the above-described component (an organic solvent).

The disperser used in the case of dispersing the pigment is not particularly limited, and examples thereof include well-known dispersers such as kneaders, roll mills, attritors, super mills, dissolvers, homogenizers, sand mills, and beads mills which are described in p. 438 of "Pigment Dictionary", Kunizou Asakura, 1$^{st}$ edition, Asakura Publishing Co., Ltd., 2000.

Furthermore, the pigment may be finely ground using a friction force by means of the mechanical grinding described in p. 310 of the same publication.

The colorant is preferably a colorant having a number-average particle diameter of 0.001 µm to 0.1 µm and more preferably a colorant of 0.01 µm to 0.08 µm from the viewpoint of the dispersion stability. The "particle diameter" mentioned herein refers to the diameter of a circle having the same area as the particle in an electron micrograph, and the "number-average particle diameter" refers to the average value of 100 particle diameters arbitrarily selected from the particle diameters of a number of particles.

The layer thickness of the photocurable resin layer including the colorant is preferably 0.5 to 10 µm, more preferably 0.8 to 5 µm, and particularly preferably 1 to 3 µm from the viewpoint of the difference in thickness from other layers. The content ratio of the colorant in the solid content of the colored photosensitive resin composition is not particularly limited, but is preferably 15% to 70% by mass, more preferably 20% to 60% by mass, and still more preferably 25% to 50% by mass from the viewpoint of sufficiently shortening the development time.

The total solid content mentioned in the present specification refers to the total mass of nonvolatile components excluding the solvent and the like from the colored photosensitive resin composition.

In a case in which the insulating layer is formed using the photosensitive film, the layer thickness of the photocurable resin layer is preferably 0.1 to 5 μm, more preferably 0.3 to 3 μm, and particularly preferably 0.5 to 2 μm from the viewpoint of maintaining the insulating property.

—Other Additives—

Furthermore, in the photocurable resin layer, other additives may be used. As the additives, it is possible to use the same additives as those used in the transfer film of the present invention.

In addition, as the solvent used in the case of manufacturing the photosensitive film by means of coating, it is possible to use the same solvent as that used in the transfer film of the present invention.

Hitherto, a case in which the photosensitive film is a negative-type material has been mainly described, but the photosensitive film may be a positive-type material. In a case in which the photosensitive film is a positive-type material, for example, the material and the like described in JP2005-221726A are used in the photocurable resin layer, but the components are not limited thereto.

(Formation of Mask Layer and Insulating Layer Using Photosensitive Film)

The mask layer 2 and the insulating layer 5 can be formed by transferring the photocurable resin layer to the front plate 1 or the like using the photosensitive film. For example, in a case in which a black mask layer 2 is formed, the black mask layer can be formed by transferring the black photocurable resin layer onto the surface of the front plate 1 using the photosensitive film having the black photocurable resin layer as the photocurable resin layer. In a case in which the insulating layer 5 is formed, the insulating layer can be formed by transferring the photocurable resin layer onto the surface of the front plate 1 in which the first transparent electrode pattern has been formed using the photosensitive film having an insulating photocurable resin layer as the photocurable resin layer.

Furthermore, when the photosensitive film having a specific layer constitution in which the thermoplastic resin layer is provided between the photocurable resin layer and the temporary support is used to form the mask layer 2 in which a light-blocking property is required, it is possible to prevent the generation of air bubbles during the lamination of the photosensitive film and form a high-quality mask layer 2 or the like from which light does not leak.

(Formation of First and Second Transparent Electrode Patterns and Additional Conductive Elements Using Photosensitive Film)

The first transparent electrode pattern 3, the second transparent electrode pattern 4, and the additional conductive element 6 can be formed by an etching treatment, using the photosensitive film having the conductive photocurable resin layer, or using the photosensitive film as a liftoff material.

—Etching Treatment—

In a case in which the first transparent electrode pattern 3, the second transparent electrode pattern 4, and the additional conductive element 6 are formed by an etching treatment, first, a transparent electrode layer such as ITO is formed on the noncontact surface of the front plate 1 on which the mask layer 2 and the like have been formed by means of sputtering. Next, an etching pattern is formed on the transparent electrode layer by means of exposure and development using the photosensitive film having a photocurable resin layer for etching as the photocurable resin layer. After that, the transparent electrode is patterned by etching the transparent electrode layer, and the etching pattern is removed, whereby the first transparent electrode pattern 3 or the like can be formed.

Even in a case in which the photosensitive film is used as an etching resist (etching pattern), resist patterns can be obtained in the same manner as in the above-described method. As the etching, it is possible to apply etching and resist peeling using the well-known method described in Paragraphs 0048 to 0054 of JP2010-152155A.

Examples of the method for etching include ordinarily-performed wet-etching methods in which subjects are immersed in etching fluids. As the etching fluid used for wet-etching, an acidic-type etching fluid or an alkali-type etching fluid may be appropriately selected depending on etching subjects. Examples of the acidic-type etching fluid include aqueous solutions of a single acidic component such as hydrochloric acid, sulfuric acid, hydrofluoric acid, or phosphoric acid, mixed aqueous solutions of an acidic component and a salt such as iron (III) chloride, ammonium fluoride, or potassium permanganate, and the like. As the acidic component, a component obtained by combining a plurality of acidic components may be used. In addition, examples of the alkali-type etching fluid include aqueous solution of a single alkali component such as a salt of an organic amine such as sodium hydroxide, potassium hydroxide, ammonia, an organic amine, or tetramethyl ammonium hydroxide, mixed aqueous solutions of an alkali component and a salt such as potassium permanganate, and the like. As the alkali component, a component obtained by combining a plurality of alkali components may be used.

The temperature of the etching fluid is not particularly limited, but is preferably 45° C. or lower. In the present invention, a resin pattern that is used as an etching mask (etching pattern) is formed using the above-described photocurable resin layer and thus exhibit particularly excellent resistance to acidic and alkaline etching fluids in the above-described temperature range. Therefore, the peeling of the resin pattern during the etching step is prevented, and portions free of the resin pattern are selectively etched.

After the etching, a washing step and a drying step may be carried out as necessary in order to prevent line contamination. In the washing step, for example, the temporary support is washed for 10 to 300 seconds with pure water at normal temperature, and the drying step may be carried out by appropriately adjusting the air blow pressure (approximately 0.1 to 5 kg/cm$^2$) using an air blow.

Next, the method for peeling the resin pattern is not particularly limited, and examples thereof include a method in which the temporary support is immersed in a peeling fluid under stirring for 5 to 30 minutes at 30° C. to 80° C. and preferably at 50° C. to 80° C. The resin pattern that is used as the etching mask in the present invention exhibits excellent chemical resistance at 45° C. or lower as described above, but exhibits a property of being swollen by alkaline peeling fluids in a case in which the chemical temperature reaches 50° C. or higher. Due to the above-described properties, when the peeling step is carried out using a peeling fluid of 50° C. to 80° C., there is an advantage that the step time is shortened and the amount of the peeling residue of the resin pattern decreases. That is, when a difference is caused in the chemical temperature between the etching step and the peeling step, the resin pattern that is used as the etching mask in the present invention exhibits favorable chemical resistance in the etching step and also exhibits a favorable peeling property in the peeling step. Therefore, both conflicting characteristics such as the chemical resistance and the peeling property can be satisfied.

Examples of the peeling fluid include peeling fluids obtained by dissolving an inorganic alkali component such as sodium hydroxide or potassium hydroxide or an organic alkali component such as a tertiary amine or a quaternary ammonium salt in water, dimethyl sulfoxide, N-methyl pyrrolidone, or a mixed solution thereof. The resin pattern may be peeled using the above-described peeling fluid and a spray method, a shower method, a puddle method, or the like.

—Photosensitive Film Having Conductive Photocurable Resin Layer—

In a case in which the first transparent electrode pattern 3, the second transparent electrode pattern 4, and the additional conductive element 6 are formed using the photosensitive film having a conductive photocurable resin layer, the first transparent electrode pattern, the second transparent electrode pattern, and the additional conductive element can be formed by transferring the conductive photocurable resin layer to the surface of the front plate 1.

In a case in which the first transparent electrode pattern 3 and the like are formed using the photosensitive film having a conductive photocurable resin layer, even in the substrate (the front plate) having an opening portion, resist components do not leak through the opening portion, the rear side of the substrate is not contaminated, and it becomes possible to manufacture touch panels having advantages of thickness reduction and weight reduction with simple steps.

Furthermore, when the photosensitive film having a specific layer constitution in which the thermoplastic resin layer is provided between the conductive photocurable resin layer and the temporary support is used to form the first transparent electrode pattern 3 and the like, it is possible to prevent the generation of air bubbles during the lamination of the photosensitive film and form the first transparent electrode pattern 3, the second transparent electrode pattern 4, and the additional conductive element 6 which have excellent conductivity and small resistance.

—Use of Photosensitive Film as Liftoff Material—

In addition, it is also possible to form the first transparent electrode layer, the second transparent electrode layer, and other conductive members using the photosensitive film as a liftoff material.

In this case, desired transparent conductive layer patterns can be obtained by carrying out patterning using the photosensitive film, then, forming the transparent conductive layer on the entire surface of the temporary support, and then dissolving and removing the photocurable resin layer from each of the accumulated transparent conductive layers (a liftoff method).

<Image Display Device>

To the electrostatic capacitance-type input device of the present invention and image display devices comprising this electrostatic capacitance-type input device as a constituent element, it is possible to apply the constitution disclosed by "Latest touch panel technology" (published by Techno Times Co., Ltd. on Jul. 6, 2009), "Technology and development of touch panels" edited by Yuji Mitani, CMC Publishing Co., Ltd. (December 2004), FPD International 2009 Forum T-11 lecture textbook, Cypress Semiconductor Corporation application note AN2292, and the like.

EXAMPLES

Hereinafter, the present invention will be more specifically described using examples. Materials, amounts used, ratios, processing contents, processing orders, and the like described in the following examples can be appropriately modified within the scope of the gist of the present invention. Therefore, the scope of the present invention is not limited to specific examples described below. Meanwhile, unless particularly otherwise described, "parts" are mass-based.

Examples 1 to 13 and Comparative Examples 1 to 5

[1. Preparation of Coating Fluids]
<Preparation of Coating Fluids for Photosensitive Transparent Resin Layer>

Materials A-1 to A-10 which were coating fluids for a photosensitive transparent resin layer were prepared so as to obtain compositions as shown in Table 1.

TABLE 1

| | Material | Material A-1 | Material A-2 | Material A-3 | Material A-4 | Material A-5 | Material A-6 | Material A-7 | Material A-8 | Material A-9 | Material A-10 |
|---|---|---|---|---|---|---|---|---|---|---|---|
| Binder polymer | Compound D (acid value: 95 mgKOH/g) | 15.63 | | | | | | | | | |
| | Compound E (acid value: 65 mgKOH/g) | | 15.63 | 15.63 | 15.63 | 15.63 | 15.63 | 15.63 | 17.89 | 15.63 | 17.89 |
| | Compound F (acid value: 55 mgKOH/g) | | | | | | | | | | |
| Photopolymerizable compound | Tricyclodecane dimethanol diacrylate (A-DCP, manufactured by Shin-Nakamura Chemical Co., Ltd.) | 5.63 | 5.63 | 5.63 | 5.63 | 5.63 | 5.63 | 4.18 | 6.44 | 5.63 | 6.44 |
| | Carboxylic acid-containing monomer ARONIX TO-2349 (manufactured by Toagosei Co., Ltd.) | 0.93 | 0.93 | 0.93 | 0.93 | 0.93 | 0.93 | | 1.07 | 0.93 | 1.07 |
| | DPHA liquid (dipentaerythritol hexaacrylate: 38%, dipentaerythritol pentaacrylate: 38%, 1-methoxy-2-propyl acetate: 24%) | | | | | | | 2.38 | | | |
| | Urethane acrylate 8UX-015A (manufactured by Taisei Fine Chemical Co., Ltd.) | 2.81 | 2.81 | 2.81 | 2.81 | 2.81 | 2.81 | 2.81 | 3.22 | 2.81 | 3.22 |
| Photopolymerization initiator | Ethanone, 1-[9-ethyl-6-(2-methylbenzoyl)-9H-carbazole-3-yl]-, 1-(0-acetyloxime) (OXE-02, manufactured by BASF) | 0.11 | 0.11 | 0.11 | 0.11 | 0.11 | 0.11 | 0.11 | 0.12 | 0.11 | 0.12 |
| | 2-Methyl-1-(4-methyl thiophenyl)-2-morpholino-propan-1-one (Irgacure 907, manufactured by BASF) | 0.21 | 0.21 | 0.21 | 0.21 | 0.21 | 0.21 | 0.21 | 0.25 | 0.21 | 0.25 |
| Blocked isocyanate | Compound A | 3.63 | | | | | | | | | |
| | Compound B | | 3.63 | 3.63 | | | | | | | |
| | Compound C | | | | | | 3.63 | | | | |
| | TAKENATE B870N (manufactured by Mitsui Chemicals, Inc.) | | | | 3.63 | | | | | | |
| | DURANATE MF-K60B (manufactured by Asahi Kasei Corporation) | | | | | 3.63 | | | | | |
| Additives | MEGAFACE F780 (manufactured by DIC Corporation) | | 0.02 | | 0.02 | 0.02 | | | | | |
| | MEGAFACE F551 (manufactured by DIC Corporation) | 0.02 | | 0.02 | | | 0.02 | 0.02 | 0.02 | 0.02 | 0.02 |
| Solvent | 1-Methoxy-2-propyl acetate | 46.66 | 46.66 | 46.66 | 46.66 | 46.66 | 46.66 | 46.66 | 48.88 | 46.66 | 48.88 |
| | Methyl ethyl ketone | 40.00 | 40.00 | 40.00 | 40.00 | 40.00 | 40.00 | 40.00 | 40.00 | 40.00 | 40.00 |
| | Total (parts by mass) | 100 | 100 | 100 | 100 | 100 | 100 | 100 | 100 | 100 | 100 |

Compound A
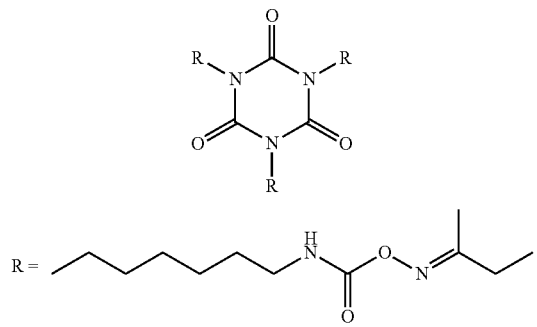
Compound B
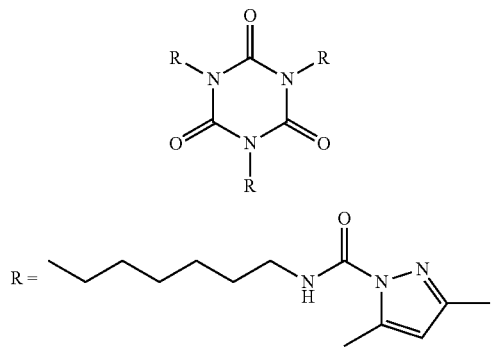
Compound C
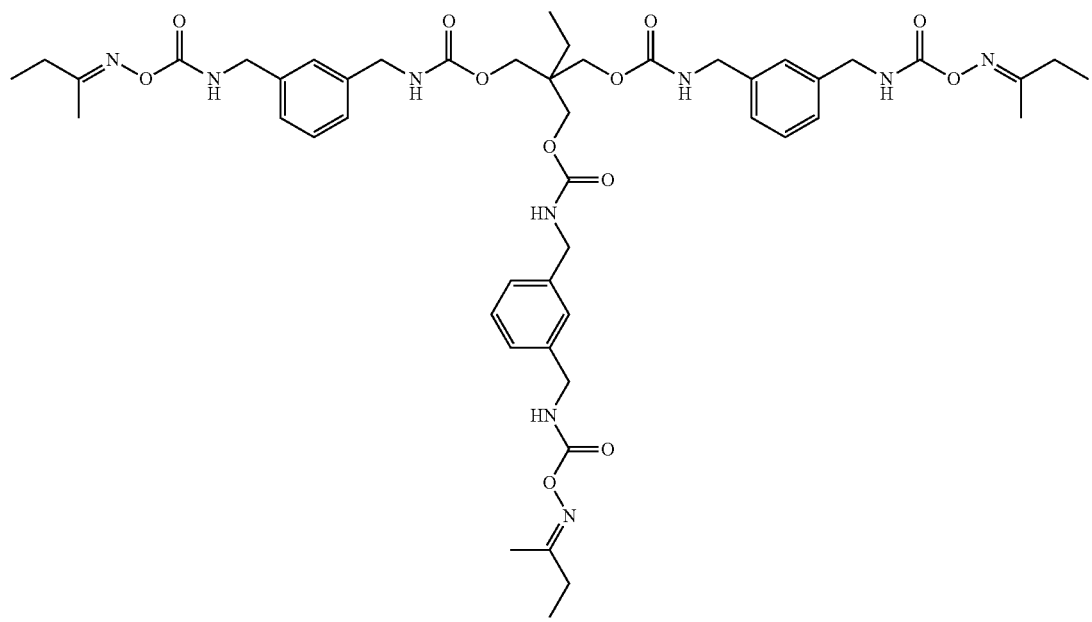
Compound D
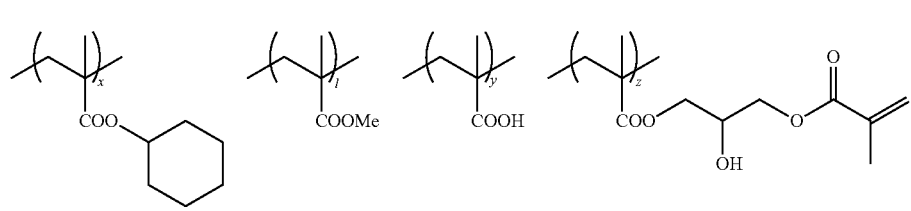
x/l/y/z = 51.5/2/26.5/20
Compound E
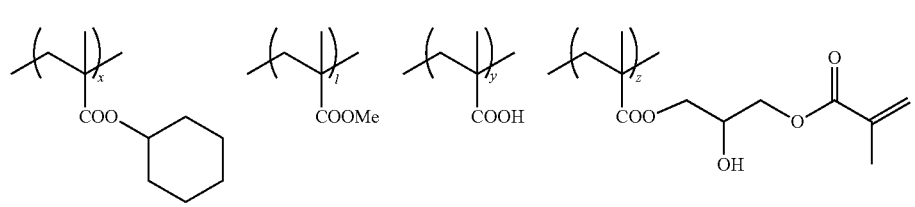
x/l/y/z = 43/2/20/35

-continued

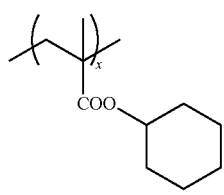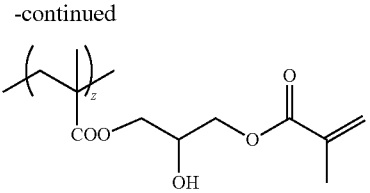

Compound F x/l/y/z = 62/2/16/20

<Measurement of Dissociation Temperatures>

The dissociation temperatures of the blocked isocyanates used in the respective examples were the temperature of an endothermic peak generated by a deprotection reaction of the blocked isocyanate in the case of being measured by means of DSC using a differential scanning calorimeter (manufactured by Seiko Instruments Inc., DSC6200). The obtained results were shown in Table 4.

<Preparation of Coating Fluids for Second Transparent Resin Layer>

Materials B-1 and B-2 which were coating fluids for a second transparent resin layer were prepared so as to obtain compositions as shown in Table 2.

TABLE 2

| Material | Material B-1 | Material B-2 |
|---|---|---|
| NanoUse OZ-S30M: $ZrO_2$ particles, methanol dispersion liquid (nonvolatile component: 30.5%) manufactured by Nissan Chemical Industries, Ltd. | 0.00 | 4.20 |
| Ammonia water (2.5%) | 7.84 | 7.84 |
| Copolymer resin of methacrylic acid/allyl methacrylate (Mw: 25,000, compositional ratio = 40/60, nonvolatile component: 99.8%) | 6.00 | 0.50 |
| Carboxylic acid-containing monomer ARONIX TO-2349 (manufactured by Toagosei Co., Ltd.) | 0.50 | 0.04 |
| Benzotriazole BT120 (manufactured by Johoku Chemical Co., Ltd.) | 0.50 | 0.04 |
| MEGAFACE F444 (manufactured by DIC Corporation) | 0.01 | 0.01 |
| Ion-exchange water | 25.16 | 27.38 |
| Methanol | 60.00 | 60.00 |
| Total (parts by mass) | 100 | 100 |

[2. Production of Transfer Films]

As the temporary support, a polyethylene terephthalate film having a film thickness of 16 μm was prepared. Any one of Materials A-1 to A-10 for the photosensitive transparent resin layer was ejected onto this temporary support from slit-shaped nozzles while adjusting the application amount so that the film thickness of the dried photosensitive transparent resin layer reached a film thickness shown in Table 4, thereby forming a photosensitive transparent resin layer. Next, after the solvent was volatilized in a drying zone at 120° C., any one of Materials B-1 and B-2 was ejected from slit-shaped nozzles while adjusting the application amount so that the dried film thickness reached a film thickness of 0.1 μm. After that, the film was dried, thereby forming a second transparent resin layer.

[3. Production of Transparent Electrode Pattern Film Used to Produce Laminate]

<Formation of Transparent Film>

A cycloolefin resin film having a film thickness of 38 μm and a refractive index of 1.53 was prepared. The surface of this cycloolefin resin film was reformed using a high-frequency oscillator. The surface was reformed by means of a corona discharge treatment carried out using a wire electrode having a diameter of 1.2 mm under set conditions of the electrode length of 240 mm, the distance between working electrodes of 1.5 mm, the output voltage of 100%, the output of 250 W, and the treatment duration of 3 seconds. The obtained film was used as a transparent film substrate.

Next, each of Material-C shown in Table 3 was ejected onto the transparent film substrate from slit-shaped nozzles, thereby coating the transparent film substrate. After that, the transparent film substrate was irradiated with ultraviolet rays (at an integral of light of 300 mJ/cm$^2$) and dried at approximately 110° C. Therefore, a transparent film having a refractive index of 1.60 and a film thickness of 80 nm was formed.

TABLE 3

| Material | Material-C |
|---|---|
| $ZrO_2$: manufactured by Solar Co., Ltd., ZR-010 | 2.08 |
| DPHA liquid (dipentaerythritol hexaacrylate: 38%, dipentaerythritol pentaacrylate: 38%, 1-methoxy-2-propyl acetate: 24%) | 0.29 |
| Urethane-based monomer: NK OLIGOMER UA-32P, manufactured by Shin-Nakamura Chemical Co., Ltd., nonvolatile component: 75%, 1-methoxy-2-propyl acetate: 25% | 0.14 |
| Monomer mixture (the polymerizable compound (b2-1) described in Paragraph "0111" of JP2012-78528A, n = 1: the content ratio of tripentaerythritol octaacrylate: 85%, the sum of n = 2 and n = 3 as impurities: 15%) | 0.36 |
| Polymer solution 1 (Structural Formula P-25 described in "0058" of JP2008-146018A: the weight-average molecular weight = 35,000, solid content: 45%, 1-methoxy-2-propyl acetate: 15%, 1-methoxy-2-propanol: 40%) | 1.89 |
| Photoradical polymerization initiator: 2-benzyl-2-dimethylamino-1-(4-morpholinophenyl)-butanone (IRGACURE 379, manufactured by BASF) | 0.03 |
| Photopolymerization initiator: KAYACURE DETX-S (alkylthioxanthone manufactured by Nippon Kayaku Co., Ltd.) | 0.03 |
| Polymer solution 2 (polymer having a structural formula represented by Formula (3): solution having a weight-average molecular weight = 15,000, nonvolatile content: 30 wt %, methyl ethyl ketone: 70 wt %) | 0.01 |
| 1-Methoxy-2-propyl acetate | 38.73 |
| Methyl ethyl ketone | 56.80 |
| Total (parts by mass) | 100 |

Meanwhile, "wt %" in the specification is identical to "% by mass".

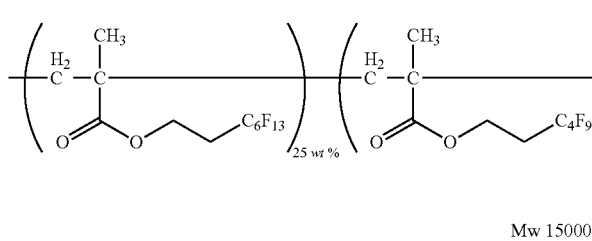 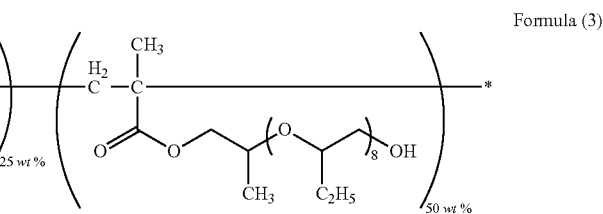

Formula (3)

Mw 15000

<Formation of Transparent Electrode Pattern>

The substrate on which the transparent film had been formed was introduced into a vacuum chamber, and an ITO thin film was formed by means of DC magnetron sputtering (conditions: the temperature of the transparent film substrate was 150° C., the argon pressure was 0.13 Pa, and the oxygen pressure was 0.01 Pa) using an ITO target (indium:tin=95:5 (molar ratio)) in which the content ratio of $SnO_2$ was 10% by mass. This ITO thin film had a thickness of 40 nm, a refractive index of 1.82, and a surface electrical resistance of 80 Ω/Ω per square). The substrate on which a transparent electrode layer had been formed was obtained in the above-described manner.

(Preparation of Photosensitive Film for Etching E1)

A 75 μm-thick polyethylene terephthalate film was prepared as the temporary support. A coating fluid for a thermoplastic resin layer made of Formulation H1 was applied and dried on this temporary support using slit-shaped nozzles, thereby forming a thermoplastic resin layer.

Next, a coating fluid for an interlayer made of Formulation P1 was applied and dried on the thermoplastic resin layer, thereby forming an interlayer (oxygen-blocking film).

Next, a coating fluid for a photocurable resin layer for etching made of Formulation E1 was applied and dried on the interlayer, thereby forming a photocurable resin layer for etching.

A laminate having the thermoplastic resin layer having a dried thickness of 15.1 μm, the interlayer having a dried thickness of 1.6 μm, and the photocurable resin layer for etching having a thickness of 2.0 μm on the temporary support was obtained in the above-described manner. Furthermore, a protective film (12 μm-thick polypropylene film) was pressed onto the photocurable resin layer for etching. A photosensitive film for etching E1 in which the temporary support, the thermoplastic resin layer, the interlayer, and the photocurable resin layer for etching were integrated together was produced.

—Coating Fluid for Photocurable Resin Layer for Etching: Formulation E1—

Methyl methacrylate/styrene/methacrylic acid copolymer (copolymer composition (% by mass): 31/40/29, weight-average molecular weight of 60,000, acid value: 163 mgKOH/g): 16 parts by mass Monomer 1 (trade name: BPE-500, manufactured by Shin-Nakamura Chemical Co., Ltd.): 5.6 parts by mass Adduct of hexamethylene diisocyanate and 0.5 mol of tetraethylene oxide monomethacrylate: 7 parts by mass Cyclohexane dimethanol monoacrylate as a compound having one polymerizable group in the molecule: 2.8 parts by mass 2-Chloro-N-butylacridone: 0.42 parts by mass 2,2-Bis(o-chlorophenyl)-4,4',5,5'-tetraphenyl biimidazole : 2.17 parts by mass Malachite green oxalate: 0.02 parts by mass Leuco crystal violet: 0.26 parts by mass Phenothiazine: 0.013 parts by mass Surfactant (trade name: MEGAFACE F-780F, manufactured by DIC Corporation) : 0.03 parts by mass Methyl ethyl ketone: 40 parts by mass 1-Methoxy-2-propanol: 20 parts by mass Meanwhile, the viscosity of the coating fluid for a photocurable resin layer for etching E1 after the removal of the solvent at 100° C. was 2,500 Pa·sec.

—Coating Fluid for Thermoplastic Resin Layer: Formulation H1—

Methanol: 11.1 parts by mass

Propylene glycol monomethyl ether acetate: 6.36 parts by mass

Methyl ethyl ketone: 52.4 parts by mass

Methyl methacrylate/2-ethylhexyl acrylate/benzyl methacrylate/methacrylic acid copolymer (copolymerization compositional ratio (molar ratio)=55/11.7/4.5/28.8, molecular weight=100,000, glass transition temperature (Tg)≈70° C.): 5.83 parts by mass Styrene/acrylic acid copolymer (copolymerization compositional ratio (molar ratio)=63/37, weight-average molecular weight=10,000, Tg≈100° C.): 13.6 parts by mass Monomer 1 (trade name: BPE-500, manufactured by Shin-Nakamura Chemical Co., Ltd.): 9.1 parts by mass Fluorine-based polymer: 0.54 parts by mass The fluorine-based polymer is a copolymer of 40 parts of $C_6F_{13}CH_2CH_2OCOCH=CH_2$, 55 parts of $H(OCH(CH_3)CH_2)_7OCOCH=CH_2$, and 5 parts of $H(OCHCH_2)_7OCOCH=CH_2$ and a solution of 30% by mass of methyl ethyl ketone having a weight-average molecular weight of 30,000 (trade name: MEGAFACE F780F, manufactured by DIC Corporation).

—Coating Fluid for Interlayer: Formulation P1—

Polyvinyl alcohol: 32.2 parts by mass (trade name: PVA205, manufactured by Kuraray Co., Ltd., degree of saponification=88%, degree of polymerization 550)

Polyvinyl pyrrolidone: 14.9 parts by mass (trade name: K-30, manufactured by ISB Corporation)

Distilled water: 524 parts by mass

Methanol: 429 parts by mass (Formation of Transparent Electrode Pattern)

The substrate on which the transparent electrode layer had been formed was washed. The photosensitive film for etching E1 from which the protective film had been removed was laminated so that the photocurable resin layer for etching and the transparent electrode layer faced each other. The set lamination conditions were the temperature of the substrate of 130° C., the rubber roller temperature of 120° C., the linear pressure of 100 N/cm, and the transportation rate of 2.2 m/minute. Next, the temporary support was peeled off from the photosensitive film for etching E1. After that, an exposure mask was installed so that the distance from the photocurable resin layer for etching reached 200 μm and was pattern-exposed at an exposure amount of 50 mJ/cm$^2$ (i rays). This exposure mask was made of silica and had a desired transparent electrode pattern.

Next, a development treatment was carried out on the exposed substrate at 25° C. for 100 seconds using a triethanolamine-based developer (containing 30% by mass of triethanolamine, a liquid obtained by diluting trade name: T-PD2 (manufactured by Fujifilm Corporation) with pure water ten times). Next, the substrate was treated at 33° C. for 20 seconds using a surfactant-containing washing liquid (a liquid obtained by diluting T-SD3 (trade name, manufactured by Fujifilm Corporation) with pure water ten times). After that, ultrapure water was sprayed from ultrahigh-pressure washing nozzles while rubbing the substrate with a rotary brush, thereby removing residues. Next, a post-baking treatment was carried out at 130° C. for 30 minutes. An photocurable resin layer for etching pattern was formed on the transparent electrode layer in the above-described manner.

Subsequently, this substrate was immersed in an etching tank filled with an ITO etchant (an aqueous solution of hydrochloric acid and potassium chloride, liquid temperature: 30° C.) for 100 seconds and etched. Therefore, exposed regions that were not covered with the photocurable resin layer for etching in the transparent electrode layer were removed. An electrode pattern was formed in the above-described manner.

Next, this substrate was immersed in a resist peeling tank filled with a resist peeling fluid (N-methyl-2-pyrrolidone, and a surfactant (trade name: SURFYNOL 465, manufactured by Air Products and Chemicals, Inc.), the liquid temperature of: 45° C.) for 200 seconds and peeled, thereby removing the photocurable resin layer for etching. Therefore, a film having the transparent film and the transparent electrode pattern (the electrode of the electrostatic capacitance-type input device) formed on the transparent film substrate (hereinafter, in some cases, referred to as "the substrate including the electrodes of the electrostatic capacitance-type input device") was obtained.

[4. Production of Laminates of Examples and Comparative Examples]

The transfer film of each of the examples and the comparative examples, from which the protective film had been removed, was transferred to the substrate including the electrode of the electrostatic capacitance-type input device. In this case, the second transparent resin layer, the photosensitive transparent resin layer, and the temporary support were transferred in this order so that the second transparent resin layer in the transfer film covered the transparent film and the transparent electrode pattern (the electrode of the electrostatic capacitance-type input device). The set transfer conditions were the temperature of the transparent film substrate of 40° C., the rubber roller temperature of 110° C., the linear pressure of 3 N/cm, and the transportation rate of 2 m/minute.

After that, the laminate was pattern-exposed through the temporary support using a proximity-type stepper having an ultrahigh-pressure mercury lamp (manufactured by Hitachi High-Tech Fielding Corporation). In this case, a silica exposure mask having a pattern for forming an overcoat layer was used as an exposure mask, the distance between this exposure mask and the temporary support was set to 125 μm, and the exposure amount was set to 100 mJ/cm$^2$ (i rays).

After the peeling of the temporary support, a washing treatment was carried out using an aqueous solution of 2% sodium carbonate at 32° C. for 60 seconds. Ultrapure water was sprayed to the washed transparent film substrate from ultrahigh-pressure washing nozzles, thereby removing residues. Subsequently, moisture on the transparent film substrate was removed by blowing air, and heating (post-basking) treatment was carried out at 145° C. for 30 minutes. Therefore, a laminate in which the transparent film, the transparent electrode pattern (the electrode of the electrostatic capacitance-type input device), the second transparent resin layer, and the photosensitive transparent resin layer were continuously provided in this order on the transparent film substrate was formed.

[Evaluation of Transfer Film]

<Evaluation of Heat and Moisture Resistance After Supply of Saline Water>

The transfer film of each of the examples and the comparative examples, from which the protective film had been removed, was transferred onto a PET film on which a copper foil (alternatively used as the electrode of the electrostatic capacitance-type input device) had been laminated (manufactured by Geomatec Co., Ltd.). The second transparent resin layer and the photosensitive transparent resin layer were transferred in the same manner as in the method for transferring the layers to the film having the transparent film and the transparent electrode pattern formed on the transparent film substrate, and post processes (the peeling, development, post-baking, and the like of the temporary support) were carried out, thereby obtaining a specimen.

Saline water having a concentration of 50 g/L (5 cm$^3$) was added dropwise to the film surface of the photosensitive transparent resin layer in the specimen and was evenly spread to 50 cm$^2$. After that, moisture was volatilized at normal temperature, and the specimen was stored at a high temperature and a high humidity (85° C., a relative humidity: 85%) for 72 hours. After that, the saline water was wiped, and the surface state of the specimen was observed and evaluated according to the following evaluation points.

The heat and moisture resistance after the supply of saline water is practically required to be A or B and is preferably A. The evaluation results are shown in Table 4.

A: Copper, the second transparent resin layer surface, and the photosensitive transparent resin layer surface did not change.

B: A small number of marks were observed on the second transparent resin layer surface or the photosensitive transparent resin layer surface, but copper did not change.

C: Copper was discolored.

[Evaluation of Laminate]

<Evaluation of Developability>

The transfer film of each of the examples was transferred onto the substrate including the electrode of the electrostatic capacitance-type input device. After that, the laminate was pattern-exposed through the temporary support using a proximity-type stepper having an ultrahigh-pressure mercury lamp (manufactured by Hitachi High-Tech Fielding Corporation). In this case, a silica exposure mask having a pattern for forming an overcoat layer was used as an exposure mask, the distance between this exposure mask and the temporary support was set to 125 μm, and the exposure amount was set to 100 mJ/cm$^2$ (i rays).

After the peeling of the temporary support, a washing treatment was carried out using an aqueous solution of 2% sodium carbonate at 32° C. for 60 seconds. After that, the laminate was observed visually and using an optical microscope.

The developability is practically required to be A, B, or C, more preferably A or B, and particularly preferably A. The evaluation results are shown in Table 4.

<<Evaluation Standards>>

A: It was not possible to observe residues on the non-exposed portions with the microscope.

B: It was not possible to visually observe residues on the non-exposed portions.

C: It was possible to visually observe residues on the non-exposed portions.

D: There were non-developed portions in the non-exposed portions, and it was possible to visually observe a number of residues.

E: The temporary support could not be peeled off from the substrate, and it was not possible to evaluate the developability.

<Evaluation of Adhesiveness>

For the laminate in which the transparent film, the transparent electrode pattern, the second transparent resin layer, and the photosensitive transparent resin layer were laminated in this order on the transparent film substrate, a cross-cut test of 100 film specimens was carried out with reference to Japanese Industrial Standards (JIS) (K5400). Specifically, an indentation was formed on the test surface of the laminate in a one square millimeter lattice pattern using a cutter knife, and transparent adhesive tape #600 (manufactured by The 3M Company) was strongly pressed thereon and peeled off in a 180° C. direction. After that, the state of the lattice pattern was observed, and adhesiveness was evaluated according to the following evaluation points. The adhesiveness is preferably A, B, or C, more preferably A or B, and particularly preferably A. The evaluation results are shown in Table 4.

A: The tape adhered in almost 100% of the total area.

B: The tape adhered and remained in 95% or more and less than 100% of the total area.

C: The tape adhered and remained in 65% or more and less than 95% of the total area.

D: The tape adhered and remained in 35% or more and less than 65% of the total area (practically permissible).

E: The tape adhered and remained in less than 35% of the total area.

<Evaluation of Transmittance>

The luminous transmittance regulated by JIS K 7361 of Japanese Industrial Standards (JIS) was measured using the laminate in which the transparent film, the transparent electrode pattern, the second transparent resin layer, and the photosensitive transparent resin layer were laminated in this order on the transparent film substrate and NDH4000 (manufactured by Nippon Denshoku Industries Co., Ltd.). The results are shown in Table 4.

<Evaluation of Transparent Electrode Pattern-Covering Properties>

The laminate in which the transparent film, the transparent electrode pattern, the second transparent resin layer, and the photosensitive transparent resin layer were laminated in this order on the transparent film substrate and a black PET material were made to adhere together through transparent adhesive tape (manufactured by The 3M Company, trade name: OCA tape 8171CL) so as to shield the entire substrate from light.

The transparent electrode pattern-covering properties were evaluated in the following manner: light was incident on the transparent film substrate surface side using a fluorescent lamp (light source) and the produced substrate in a dark room, and reflected light from the surface of the transparent film substrate was visually observed at an inclined angle. The transparent electrode pattern-covering properties are preferably A, B, or C, more preferably A or B, and particularly preferably A. The evaluation results are shown in Table 4.

<<Evaluation Standards>>

A: The transparent electrode pattern was not observed.

B: The transparent electrode pattern was slightly observed, but barely observed.

C: The transparent electrode pattern was observed (not easy to be recognized).

D: The transparent electrode pattern was observed within a practically permissible range.

E: The transparent electrode pattern was clearly observed (easy to be recognized).

TABLE 4

| | Photosensitive transparent resin layer | | | | | Second transparent resin layer | | | Heat and moisture resistance after supply of saline water | Developability | Adhesiveness | Transmittance | Transparent electrode pattern-covering properties |
|---|---|---|---|---|---|---|---|---|---|---|---|---|---|
| | | Binder | | Blocked isocyanate | | | | | | | | | |
| | Material | polymer acid value | Carboxylic acid-containing monomer | Kind | Dissociation temperature | Thickness | Material | Refractive index | | | | | |
| Example 1 | Material A-1 | 95 mgKOH/g | Present | Compound A | 140° C. | 8 μm | None | — | A | A | A | 88.0% | D |
| Example 2 | Material A-1 | 95 mgKOH/g | Present | Compound A | 140° C. | 8 μm | Material B-1 | 1.50 | A | A | A | 88.0% | D |
| Example 3 | Material A-1 | 95 mgKOH/g | Present | Compound A | 140° C. | 8 μm | Material B-2 | 1.65 | A | A | A | 90.5% | A |
| Example 4 | Material A-2 | 65 mgKOH/g | Present | Compound A | 140° C. | 8 μm | Material B-2 | 1.65 | B | B | A | 90.5% | A |
| Example 5 | Material A-3 | 95 mgKOH/g | Present | Compound B | 120° C. | 8 μm | Material B-2 | 1.65 | B | B | B | 90.5% | A |
| Example 6 | Material A-4 | 95 mgKOH/g | Present | B870N | 170° C. | 8 μm | Material B-2 | 1.65 | A | A | B | 90.5% | A |
| Example 7 | Material A-5 | 95 mgKOH/g | Present | MF-K60B | 90° C. | 8 μm | Material B-2 | 1.65 | B | B | B | 90.5% | A |
| Example 8 | Material A-6 | 95 mgKOH/g | Present | Compound C | 140° C. | 8 μm | Material B-2 | 1.65 | A | A | B | 90.5% | A |
| Example 9 | Material A-7 | 95 mgKOH/g | Absent | Compound A | 140° C. | 8 μm | Material B-2 | 1.65 | B | A | B | 90.5% | A |
| Example 10 | Material A-1 | 95 mgKOH/g | Present | Compound A | 140° C. | 1 μm | Material B-2 | 1.65 | A | A | A | 90.5% | A |
| Example 11 | Material A-1 | 95 mgKOH/g | Present | Compound A | 140° C. | 3 μm | Material B-2 | 1.65 | A | A | A | 90.0% | A |
| Example 12 | Material A-1 | 95 mgKOH/g | Present | Compound A | 140° C. | 15 μm | Material B-2 | 1.65 | A | A | A | 88.0% | D |
| Example 13 | Material A-1 | 95 mgKOH/g | Present | Compound A | 140° C. | 25 μm | Material B-2 | 1.65 | A | A | A | 88.0% | D |
| Comparative Example 1 | Material A-8 | 95 mgKOH/g | Present | None | — | 8 μm | None | — | C | A | A | 88.0% | D |
| Comparative Example 2 | Material A-9 | 55 mgKOH/g | Present | Compound A | 140° C. | 8 μm | None | — | A | D | A | 90.5% | A |
| Comparative Example 3 | Material A-8 | 95 mgKOH/g | Present | None | — | 8 μm | Material B-2 | 1.65 | C | A | A | 90.5% | A |
| Comparative Example 4 | Material A-10 | 65 mgKOH/g | Present | None | — | 8 μm | Material B-2 | 1.65 | A | B | A | 90.5% | A |
| Comparative Example 5 | Material A-9 | 55 mgKOH/g | Present | Compound B | 140° C. | 8 μm | Material B-2 | 1.65 | A | D | A | 90.5% | A |

From Table 4, it was found that the transfer film of the present invention can be used to form electrode protective films for electrostatic capacitance-type input devices which are excellent in terms of both heat and moisture resistance after the supply of saline water and developability.

In addition, it was found that, in the constitution in which $ZrO_2$ particles were added to the second transparent resin layer in Examples 3 to 13, the refractive index of the second transparent resin layer reached 1.65, and it was possible to form electrode protective films for electrostatic capacitance-type input devices which were excellent in terms of transparent electrode pattern-covering properties.

In addition, it was found that, in the constitution in which Compound A was used as the blocked isocyanate in Examples 1 to 4 and 10 to 13 and at least one photopolymerizable compound having an ethylenic unsaturated group contained a carboxyl group, it was possible to form electrode protective films for electrostatic capacitance-type input devices which were excellent in terms of adhesiveness.

On the other hand, in Comparative Examples 1, 3, and 4 in which the blocked isocyanate was not used in the photosensitive transparent resin layer, the heat and moisture resistance after the supply of saline water was poor.

In Comparative Examples 2 and 5 in which the binder polymer having an acid value that was not 60 mgKOH/g or more was used, the developability was poor in all of the constitutions.

In addition, as a result of analyzing the same sample as that in the measurement of transmittance using a two-dimensional infrared spectrophotometer FTS60A/896 (manufactured by Digilab Inc.), the peak of the carboxylic acid anhydride could be confirmed in the laminates of Examples 1 to 13 and Comparative Examples 2 and 5, but the peak of the carboxylic acid anhydride was not confirmed in Comparative Examples 1, 3, and 4.

[Production of Image Display Device (Touch Panel)]

To a liquid crystal display device manufactured using the method described in <0097> to <0119> of JP2009-47936A, the previously-manufactured laminate of each example was attached, and, furthermore, a front glass plate was bound thereto. Image display devices including the laminates of the respective examples comprising the electrostatic capacitance-type input device as a constituent element were produced using a well-known method in the above-described manner.

<Evaluation of Electrostatic Capacitance-Type Input Devices and Image Display Devices>

The electrostatic capacitance-type input devices and the image display devices including the laminates of Examples 1 to 13 were excellent in terms of both developability and heat and moisture resistance after the supply of saline water.

The electrostatic capacitance-type input devices and the image display devices including the laminates of Examples 3 to 13 did not have a problem of the transparent electrode pattern being visible.

In the image display devices including the laminate of each example, the photosensitive transparent resin layer and the second transparent resin layer did not have any defects such as air bubbles, and image display devices having excellent display characteristics were obtained.

EXPLANATION OF REFERENCES

1: transparent substrate (front plate)
2: mask layer
3: transparent electrode pattern (first transparent electrode pattern)
3a: pad portion
3b: connection portion
4: transparent electrode pattern (second transparent electrode pattern)
5: insulating layer
6: additional conductive element
7: photosensitive transparent resin layer (preferably having function of transparent protective layer)
8: opening portion
10: electrostatic capacitance-type input device
11: transparent film
12: second transparent resin layer (which may have function of transparent insulating layer)
13: laminate
21: region in which transparent electrode pattern, second transparent resin layer, and photosensitive transparent resin layer are laminated in this order
22: non-patterned region
α: taper angle
26: temporary support
27: thermoplastic resin layer
28: interlayer
29: protective peeling layer (protective film)
30: transfer film
31: terminal portion of guidance wire
33: cured portion of photosensitive transparent resin layer and second transparent resin layer
34: opening portion corresponding to terminal portion of guidance wire (non-cured portion of photosensitive transparent resin layer and second transparent resin layer)
C: first direction
D: second direction

What is claimed is:

1. An electrode protective film for an electrostatic capacitance input device, the electrode protective film comprising:
   a photosensitive transparent resin layer,
   wherein the photosensitive transparent resin layer includes a binder polymer including a carboxyl group-containing acrylic resin having an acid value of 60 mgKOH/g or more, a photopolymerizable compound having an ethylenic unsaturated group, a photopolymerization initiator, and a blocked isocyanate,
   the photosensitive transparent resin layer includes two or more photopolymerizable compounds, and
   the photopolymerizable compounds include 10% by mass or more of urethane (meth)acrylate compound of all of the photopolymerizable compounds.

2. A laminate formed by transferring a photosensitive transparent resin layer onto a substrate including an electrode of an electrostatic capacitance input device using a transfer film for protecting electrodes in electrostatic capacitance input devices, the transfer film comprising,
   a temporary support; and
   a photosensitive transparent resin layer formed on the temporary support,
   wherein the photosensitive transparent resin layer includes a binder polymer including a carboxyl group-containing acrylic resin having an acid value of 60 mgKOH/g or more, a photopolymerizable compound having an ethylenic unsaturated group, a photopolymerization initiator, and a blocked isocyanate,
   the photosensitive transparent resin layer includes two or more photopolymerizable compounds, and
   the photopolymerizable compounds include 10% by mass or more of urethane (meth)acrylate compound of all of the photopolymerizable compounds.

3. A laminate comprising:

a substrate including an electrode of an electrostatic capacitance input device; and a photosensitive transparent resin layer formed on the substrate, wherein the photosensitive transparent resin layer includes a binder polymer including a carboxyl group-containing acrylic resin having an acid value of 60 mgKOH/g or more, a photopolymerizable compound having an ethylenic unsaturated group, a photopolymerization initiator, and a blocked isocyanate, the photosensitive transparent resin layer includes two or more photopolymerizable compounds, and the photopolymerizable compounds include 10% by mass or more of urethane (meth)acrylate compound of all of the photopolymerizable compounds.

4. The laminate according to claim 2, wherein the photosensitive transparent resin layer includes a carboxylic acid anhydride.

5. The laminate according to claim 2, wherein the electrode of the electrostatic capacitance input device is a transparent electrode pattern.

6. A laminate manufactured using a method for manufacturing a laminate including transferring a photosensitive transparent resin layer onto a substrate including an electrode of an electrostatic capacitance input device using an electrode protective film, the electrode protective film comprising, a temporary support; and the photosensitive transparent resin layer formed, wherein the photosensitive transparent resin layer includes a binder polymer including a carboxyl group-containing acrylic resin having an acid value of 60 mgKOH/g or more, a photopolymerizable compound having an ethylenic unsaturated group, a photopolymerization initiator, and a blocked isocyanate, the photosensitive transparent resin layer includes two or more photopolymerizable compounds, and the photopolymerizable compounds include 10% by mass or more of urethane (meth)acrylate compound of all of the photopolymerizable compounds.

7. An electrostatic capacitance input device comprising:

the laminate according to claim 2.

* * * * *